United States Patent
Matsumoto et al.

(10) Patent No.: US 9,741,230 B2
(45) Date of Patent: Aug. 22, 2017

(54) PLANT MONITORING SYSTEM, PLANT MONITORING METHOD, AND PROGRAM STORAGE MEDIUM

(71) Applicant: KABUSHIKI KAISHA TOSHIBA, Tokyo (JP)

(72) Inventors: Atsushi Matsumoto, Saitama (JP); Tsuneo Watanabe, Tokyo (JP); Akiyoshi Sudo, Tokyo (JP); Kaoru Takahara, Tokyo (JP); Keiko Ootani, Kanagawa (JP); Hiroaki Tonoyama, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/947,392

(22) Filed: Nov. 20, 2015

(65) Prior Publication Data
US 2016/0163179 A1 Jun. 9, 2016

(30) Foreign Application Priority Data

Dec. 8, 2014 (JP) .................................. 2014-248160
Dec. 16, 2014 (JP) .................................. 2014-254460

(51) Int. Cl.
*G08B 21/18* (2006.01)
*G05B 23/02* (2006.01)
(Continued)

(52) U.S. Cl.
CPC ......... *G08B 21/182* (2013.01); *G05B 13/042* (2013.01); *G05B 23/0235* (2013.01); *G05B 23/0254* (2013.01); *H01L 21/67288* (2013.01)

(58) Field of Classification Search
CPC ............ G05B 23/0235; G05B 23/0254; G05B 13/042; G05B 23/024; G05B 23/0278;
(Continued)

(56) References Cited

U.S. PATENT DOCUMENTS

2002/0173935 A1 11/2002 Miura
2008/0255681 A1* 10/2008 Scott .................. G05B 23/0216
700/12
(Continued)

FOREIGN PATENT DOCUMENTS

JP 2772179 7/1998
JP 4738309 8/2011

OTHER PUBLICATIONS

Extended European Search Report for European Application No. 15 195 606.7, dated May 3, 2016 (9 pages).

*Primary Examiner* — Mirza Alam
(74) *Attorney, Agent, or Firm* — Finnegan, Henderson, Farabow, Garrett & Dunner, L.L.P.

(57) ABSTRACT

In one embodiment, a plant monitoring system includes a threshold acquiring module, a judging module, and a warning module. The threshold acquiring module acquires in advance, based on a value obtained by leveling the dispersion in first process values corresponding to output values at a first point in a monitoring object and a value representing the dispersion, first thresholds representing a first range of the dispersion in the first process values and second thresholds representing a second range. The judging module compares the first process values chronologically acquired based on the output values at the first point with the corresponding first thresholds and second thresholds. The warning module creates alert information containing information on at least a time point when the first process value exceeds one of the first thresholds and the second thresholds.

9 Claims, 29 Drawing Sheets

(51) Int. Cl.
*G05B 13/04* (2006.01)
*H01L 21/67* (2006.01)

(58) Field of Classification Search
CPC ........ G05B 2219/31483; G08B 21/182; G08B 29/02; H01L 21/67288
See application file for complete search history.

(56) References Cited

U.S. PATENT DOCUMENTS

| | | | |
|---|---|---|---|
| 2011/0213488 A1* | 9/2011 | Suzuki ............... | G05B 23/0272 700/109 |
| 2013/0063264 A1* | 3/2013 | Oktem ................ | G05B 23/024 340/540 |
| 2013/0304419 A1* | 11/2013 | Nakamura ........ | H01L 21/67288 702/183 |
| 2014/0039834 A1* | 2/2014 | Shibuya ................ | G06F 11/22 702/183 |

* cited by examiner

| B02 | | | | | | | | |
|---|---|---|---|---|---|---|---|---|
| (FUNCTION NAME) REFERENCE VALUE MAKING | | | | | | | | |

| MONITORING PID(Y AXIS) | HK_1C0025 | CONDENSER VACUUM VALUE | hPa | ⟨PREVIOUS PID⟩ ⟨NEXT PID⟩ |
|---|---|---|---|---|

| CASE 1 | CASE 2 | CASE 3 | CASE 4 | CASE 5 | CASE 6 | CASE 7 | CASE 8 | CASE 9 |
|---|---|---|---|---|---|---|---|---|
| USED | USED | EXCLUSIVE | — | EXCLUSIVE | — | — | — | — |
| ○ | × | × | × | × | × | × | × | × |

| CONDITION NAME | [U1-1_No306] ELECTRIC MOTOR OUTPUT 100%LOAD234567890 | CONDITION CHOICE | CONDITION NOT | ☑ FAILURE |
|---|---|---|---|---|

| SEARCH PERIOD | 2012/07/18 00:00 | ▦ ⏱ | ~ | 2012/07/18 00:00 | ▦ ⏱ | | |
|---|---|---|---|---|---|---|---|
| CYCLE | ⦿ AUTO | 1 HOUR | ○ MANUAL | 10 MINUTES ▼ | MAKING LINE DEGREE | 4 ▼ | |
| X DISTRIBUTION NUMBER | 5 ▼ | | | | DEAD BAND WIDTH | 3 | % |
| LIMIT ALLOWANCE UNIT | ⦿ EU VALUE | ○ STANDARD DEVIATION σ COEFFICIENT | | | CREATOR | | |

| MODULE INDEPENDENCE DESIGNATION | X MODULE 1 ☑ | X MODULE 2 ☑ | X MODULE 3 ☑ | X MODULE 4 ☑ | X MODULE 5 ☑ | WHOLE |
|---|---|---|---|---|---|---|
| THRESHOLD | ⇧ | ⇧ | ⇧ | ⇧ | ⇧ | ⇧ |
| LIMIT ALLOWANCE (SECOND UPPER LIMIT) | 1234567890 | 1234567890 | 1234567890 | 1234567890 | 1234567890 | 1234567890 |
| LIMIT ALLOWANCE (FIRST UPPER LIMIT) | 1234567890 | 1234567890 | 1234567890 | 1234567890 | 1234567890 | 1234567890 |
| REFERENCE VALUE (AVERAGE VALUE) | 1234567890 | 1234567890 | 1234567890 | 1234567890 | 1234567890 | 1234567890 |
| STANDARD DEVIATION (σ) | 1234567890 | 1234567890 | 1234567890 | 1234567890 | 1234567890 | 1234567890 |
| LIMIT ALLOWANCE (FIRST LOWER LIMIT) | 1234567890 | 1234567890 | 1234567890 | 1234567890 | 1234567890 | 1234567890 |
| LIMIT ALLOWANCE (SECOND LOWER LIMIT) | 1234567890 | 1234567890 | 1234567890 | 1234567890 | 1234567890 | 1234567890 |
| THRESHOLD | ⇩ | ⇩ | ⇩ | ⇩ | ⇩ | ⇩ |
| | 12345678 | 12345678 | 12345678 | 12345678 | 12345678 | 12345678 EQUAL INTERVALS |

| X AXIS | HK_1C003D | CONDENSER A ENTRANCE TEMPERATURE | °C |
|---|---|---|---|

| X AXIS PID CHOICE | CORRELATION MULTI GURAFU | | ☐ EXECUTION |
|---|---|---|---|

| DELETE | FILE OUTPUT | MAKING VALUE COPY | SIMULATION |
|---|---|---|---|

| B01 | |
|---|---|
| (FUNCTION NAME) REFERENCE VALUE MAKING | |

| MONITORING PID(Y AXIS) | HK_1C0025 | CONDENSER VACUUM VALUE | hPa |
|---|---|---|---|

| CASE 1 | CASE 2 | CASE 3 | CASE 4 | CASE 5 | CASE 6 | CASE 7 |
|---|---|---|---|---|---|---|
| USED | USED | EXCLUSIVE | — | EXCLUSIVE | — | — |
| ○ | × | × | × | × | × | × |

| CONDITION NAME | 【U1-1_No306】 ELECTRIC MOTOR OUTPUT 100%LOAD234567890 | CONDITION CHOICE |
|---|---|---|

| SEARCH PERIOD | 2012/07/18 00:00 | ~ | 2012/07/18 00:00 | |
|---|---|---|---|---|
| CYCLE | ● AUTO 1 HOUR | ○ MANUAL 10 MINUTES ▼ | | |
| LIMIT ALLOWANCE UNIT | ● EU VALUE | ○ EU ABSOLUTE VALUE DESIGNATION | ○ STANDARD DEVIATION σ COEFFICIENT | |
| DEAD BAND WIDTH | 3 % | | CREATOR | |

MONITORING TYPE CHOICE

| ● THRESHOLD MONITORING | ○ CHANGE AMOUNT MONITORING | ○ DEVIATION MONITORING |
|---|---|---|
| THRESHOLD ──────── <br> LIMIT ALLOWANCE (SECOND UPPER LIMIT) 1234567890 <br> LIMIT ALLOWANCE (FIRST UPPER LIMIT) 1234567890 <br> REFERENCE VALUE (AVERAGE VALUE) 1234567890 <br> STANDARD DEVIATION (σ) 1234567890 <br> LIMIT ALLOWANCE (FIRST LOWER LIMIT) 1234567890 <br> LIMIT ALLOWANCE (SECOND LOWER LIMIT) 1234567890 <br> THRESHOLD ──────── | UPPER LIMIT VALUE ──── <br> LIMIT ALLOWANCE (UPPER LIMIT) 1234567890 <br> REFERENCE VALUE (AVERAGE VALUE) 1234567890 <br> STANDARD DEVIATION (σ) 1234567890 <br> CHANGE AMOUNT TIME DIFFERENCE CYCLE × 1 ▼ <br> CHANGE DETECTION SIGNIFICANT DIFFERENCE 12345678 | 1234567890 <br> 1234567890 <br> 1234567890 <br> DEVIATION DETECTION SIGNIFICANT DIFFERENCE 12345678 |

| ● OTHER PID CHOICE | HK_1C0032 | CONDENSER VACUUM VALUE | hPa |
|---|---|---|---|
| ○ FIXED VALUE | | | |

☐ EXECUTION

| DELETE | FILE OUTPUT | MAKING VALUE COPY | SIMULATION |
|---|---|---|---|

FIG. 18

| DISPLAY ITEM | DETAILS |
|---|---|
| OCCURRENCE DATE AND TIME | OCCURRENCE DATE AND TIME OF ALERT OR DATE AND TIME OF NORMAL RETURN |
| PID | PID NUMBER BEING FACTOR OF ALERT OUTPUT |
| NAME | PID NAME BEING FACTOR OF ALERT OUTPUT |
| MESSAGE | ALERT MESSAGE (MESSAGE AS TO WHICH OF FIRST UPPER LIMIT, SECOND UPPER LIMIT, FIRST LOWER LIMIT, AND SECOND LOWER LIMIT IS EXCEEDED) |
| MONITORING TYPE | ANOMALY MONITORING TYPE: "CORRELATION MONITORING, CORRELATION THREE-DIMENSIONAL MONITORING, CHRONOLOGICAL MONITORING, CHRONOLOGICAL CHANGE RATE MONITORING, CHRONOLOGICAL DEVIATION MONITORING" |
| CONDITION NAME | NAME OF DETECTED CONDITION |
| NEGATED CONDITION | PRESENCE OF "SETTING OF NOT" FOR CONDITION |
| CREATOR | CREATOR OF MONITORING |
| VALUE OF X | VALUE OF X IN ANOMALY DETECTION |
| MODULE OF X | MODULE OF X IN ANOMALY DETECTION |
| CATEGORY OF X | CATEGORY OF X IN ANOMALY DETECTION |
| VALUE OF Z | VALUE OF Z IN ANOMALY DETECTION |
| MODULE OF Z | MODULE OF Z IN ANOMALY DETECTION |
| CATEGORY OF Z | CATEGORY OF Z IN ANOMALY DETECTION |

FIG. 19

| RECORD NUMBER | OCCURRENCE DATE AND TIME | PID | NAME | MESSAGE | MONITORING TYPE | CONDITION NAME | NEGATED CONDITION | CREATOR | VALUE X | THE MODULE OF X | CATEGORY X | VALUE Z | THE MODULE OF Z | CATEGORY Z |
|---|---|---|---|---|---|---|---|---|---|---|---|---|---|---|
| 1 | yyyymmdd HHMM | PID 12345 | PID NAME | VALUE XX 0.12 > FIRST UPPER LIMIT VALUE 0.10 | CORRELATION MONITORING | CONDITION NAME | YES | ATSUSHI MATSUMOTO | 230 | °C | 2 | | | |
| 2 | yyyymmdd HHMM | PID 12346 | PID NAME | VALUE XX 0.12 < FIRST LOWER LIMIT VALUE 0.15 | CORRELATION THREE-DIMENSIONAL MONITORING | CONDITION NAME | NO | ATSUSHI MATSUMOTO | 651 | °C | 3 | 12.7 | °C | 5 |
| 3 | yyyymmdd HHMM | PID 12347 | PID NAME | VALUE XX 0.12 | CORRELATION MONITORING | CONDITION NAME | NO | ATSUSHI MATSUMOTO | 987.45 | °C | 4 | | | |
| 4 | yyyymmdd HHMM | PID 12348 | PID NAME | VALUE XX 42.8 > FIRST UPPER LIMIT VALUE 43.0 | CORRELATION CHANGE RATE MONITORING | CONDITION NAME | YES | ATSUSHI MATSUMOTO | 12.7 | °C | 5 | | | |
| 5 | yyyymmdd HHMM | PID 12349 | PID NAME | VALUE XX 23.2 < FIRST LOWER LIMIT VALUE 23.0 | CORRELATION DEVIATION MONITORING | CONDITION NAME | YES | ATSUSHI MATSUMOTO | 642 | °C | 6 | | | |

FIG. 20

| ALERT MESSAGE (TREND) | | | | | |
|---|---|---|---|---|---|
| OCCURRENCE DATE AND TIME | PID | NAME | MESSAGE | CURRENT VALUE | LIMIT VALUE |
| 2014/08/09 15:30:00 | TAG1234 | MAIN STEAM TEMPERATURE | TEMPERATURE OF XXXXXXXX | 350°C > | 360°C |
| YYYY/MM/DD hh:mm:ss | TAG2345 | XXXX | PRESSURE OF XXXXXXX | 10.5MPa > | 15MPa |
| YYYY/MM/DD hh:mm:ss | TAG4444 | XXXX | DEVICE FAILURE OCCURRED IN XXXXX | | |
| YYYY/MM/DD hh:mm:ss | TAG0022 | XXXX | SENSOR ANOMALY OCCURRED IN XXXX | | |
| YYYY/MM/DD hh:mm:ss | TAG9876 | XXXX | TEMPERATURE OF XXXXXX | 530°C < | 520°C |
| YYYY/MM/DD hh:mm:ss | TAG7788 | XXXX | TEMPERATURE OF XXXXXXX | 3000°C < | 2500°C |

FIG. 21

| ALERT MESSAGE (HISTORY) | | | | | |
|---|---|---|---|---|---|
| OCCURRENCE DATE AND TIME | PID | NAME | MESSAGE | CURRENT VALUE | LIMIT VALUE |
| 2014/08/03 20:17:32 | TAG1234 | MAIN STEAM TEMPERATURE | TEMPERATURE OF XXXXXXXX | 350°C > | 360°C |
| YYYY/MM/DD hh:mm:ss | TAG2345 | XXXX | PRESSURE OF XXXXXXX | 10.5MPa > | 15MPa |
| YYYY/MM/DD hh:mm:ss | TAG4444 | XXXX | DEVICE FAILURE OCCURRED IN XXXXX | | |
| YYYY/MM/DD hh:mm:ss | TAG0022 | XXXX | SENSOR ANOMALY OCCURRED IN XXXX | | |
| YYYY/MM/DD hh:mm:ss | TAG9876 | XXXX | TEMPERATURE OF XXXXXX | 530°C < | 520°C |
| YYYY/MM/DD hh:mm:ss | TAG7788 | XXXX | TEMPERATURE OF XXXXXXX | 3000°C < | 2500°C |
| YYYY/MM/DD hh:mm:ss | TAG2348 | XXXX | DEVICE FAILURE OCCURRED IN XXXXX | | |
| YYYY/MM/DD hh:mm:ss | TAG0453 | XXXX | SENSOR ANOMALY OCCURRED IN XXXX | | |
| YYYY/MM/DD hh:mm:ss | TAG1382 | XXXX | LOW TEMPERATURE OCCURRED IN XXXXXX | | |
| YYYY/MM/DD hh:mm:ss | TAG9987 | XXXX | HIGH TEMPERATURE OCCURRED IN XXXXXXX | | |
| YYYY/MM/DD hh:mm:ss | TAG3864 | XXXX | RETURN FROM LOW PRESSURE IN XXXXXXX | | |
| YYYY/MM/DD hh:mm:ss | TAG1049 | XXXX | DEVICE FAILURE OCCURRED IN XXXXX | | |
| YYYY/MM/DD hh:mm:ss | TAG8874 | XXXX | SENSOR ANOMALY OCCURRED IN XXXX | | |
| YYYY/MM/DD hh:mm:ss | TAG3536 | XXXX | LOW TEMPERATURE OCCURRED IN XXXXXX | | |
| YYYY/MM/DD hh:mm:ss | TAG4564 | XXXX | HIGH TEMPERATURE OCCURRED IN XXXXXXX | | |
| YYYY/MM/DD hh:mm:ss | TAG5656 | XXXX | LOW TEMPERATURE OCCURRED IN XXXXXX | | |
| YYYY/MM/DD hh:mm:ss | TAG6767 | XXXX | HIGH TEMPERATURE OCCURRED IN XXXXXXX | | |
| YYYY/MM/DD hh:mm:ss | TAG2345 | XXXX | RETURN FROM LOW PRESSURE IN XXXXXXX | | |

FIG. 22

| ACCIDENT SIGN DETECTION THRESHOLD CALCULATION SETTING VALUE | | SET FROM DIALOG SCREEN | CALCULATED AND SET THROUGH STATISTIC CALCULATION | MONITORING CONDITION EXPLANATION NUMBER |
|---|---|---|---|---|
| | | | | 2-7 |
| SIGN APPEARING PERIOD | PERIODS OF t2 AND t3 : INITIAL VALUE ONE HOUR | ◯ | | 2-7-1 |
| INCREASE OF VALUE | ONE HOUR | ◯ | | 2-7-2 |
| MAXIMUM TIME | 30 DAYS | ◯ | | 2-7-3 |
| NORMAL PERIOD | PERIODS OF t1 AND t2 : QUADRUPLE OF SIGNED PERIOD | | | 2-7-3 |
| NUMBER OF ALERTS DURING SOUND PERIOD | | | ◯ | 2-7-4 |
| NUMBER OF ALERTS DURING SIGNED PERIOD | | | ◯ | 2-7-5 |

FIG. 32

PLANT MONITORING SYSTEM, PLANT MONITORING METHOD, AND PROGRAM STORAGE MEDIUM

CROSS REFERENCE TO RELATED APPLICATIONS

This application is based upon and claims the benefit of priority from the prior Japanese Patent Application No. 2014-248160, filed on Dec. 8, 2014, and the prior Japanese Patent Application No. 2014-254460, filed on Dec. 16, 2014, the entire contents of which are incorporated herein by reference.

FIELD

Embodiments described herein relate to a plant monitoring system, a plant monitoring method, and a program medium.

BACKGROUND

In general, in plants such as power plants, the state of a plant is monitored to prevent a state such as an accident or a stop in operation. To monitor a plant, for example, points to be monitoring objects included in monitoring items in a plant (e.g., called a PID or TAG) are defined. Furthermore, the state of a plant is monitored by comparing an upper limit value and a lower limit value as thresholds that are set for a point in a monitoring object with a process value acquired from the point in the monitoring object. In this case, the judgment of the presence of an anomaly is made by judging whether the process value exceeds the upper limit value or the lower limit value.

In addition, in order to improve judgment accuracy, there have been introduced techniques to improve the search accuracy of judgment by calculating these upper limit value and lower limit value using the average value, the standard deviation, and the like of past plant data in a monitoring point. Furthermore, a method has been used in which a main variable point for a point to be monitored (a point having a strong correlation) is found, and under a correlation with the main variable point, an upper limit value and a lower limit value from which the operating state or the variations in a plant are eliminated are set to perform monitoring. For example, one such method is to find a main variable point for a monitoring point, divide a monitoring zone into some clusters, and calculate a monitoring threshold using a weight coefficient with respect to the number of data items of the monitoring point to perform monitoring.

However, although some points can be monitored in such a method, it has been known that some monitoring points cannot be accurately monitored by these method of cluster division, method of calculating monitoring threshold, and method of using weight coefficient.

In addition, it has been known that some monitoring points have no main variable points. That is, there are monitoring items that cannot be monitored using only a correlation with the main variable point, and a new monitoring method that supports the characteristics of monitoring items is needed.

In addition, the investigation of appropriateness or validity of thresholds and a new monitoring method that supports the characteristics of monitoring items are performed while the operation of a plant is continued. For this reason, it takes a long time to investigate the appropriateness or validity of effective thresholds or the new monitoring method.

In addition, a plant monitoring system is required not only to monitor the state of a plant that reaches an alerting zone but also to monitor the state of a sign or a precursor before reaching the alerting zone, as a monitoring item.

The present invention thus has an object to provide a plant monitoring system by which the accuracy in state monitoring of a plant can be enhanced.

BRIEF DESCRIPTION OF THE DRAWINGS

FIG. 16 is a diagram showing a screen example in the case where correlation monitoring (zone correlation monitoring) is specified as a monitoring method;

FIG. 17 is a diagram showing a screen example in the case where the correlation three-dimensional monitoring is specified;

FIG. 18 is a diagram showing a screen example in the case where the chronological process value monitoring, the chronological change rate monitoring, or the chronological deviation monitoring is specified;

FIG. 19 is a diagram for illustrating items as alert information created by a warning module 10;

FIG. 20 is a diagram for illustrating alert information created by the warning module 10;

FIG. 21 is a diagram showing an example of an alert message (trend);

FIG. 22 is a diagram showing an example of an alert message (history);

FIG. 32 is a diagram for illustrating setting information used by an automatic calculation controller 21;

DETAILED DESCRIPTION

Embodiments will now be explained with reference to the accompanying drawings.

In one embodiment, a plant monitoring system includes a threshold acquiring module, a judging module, and a warning module. The threshold acquiring module acquires in advance, based on a value that is obtained by averaging dispersion in first process values corresponding to output values at a first point in a monitoring object and a value that represents the dispersion, first thresholds that represent a first range of the dispersion in the first process values, and second thresholds that represent a second range, which is a range wider than the first range in dispersion. The judging module compares the first process values that are chronologically acquired based on the output values at the first point with the corresponding first thresholds and second thresholds to judge whether the first process value exceeds either the first thresholds or the second thresholds. The warning module creates, based on a judgment result from the judging module, alert information that contains information at the time when the first process value exceeds either the first thresholds or the second thresholds.

(First Embodiment)

Figure 1:
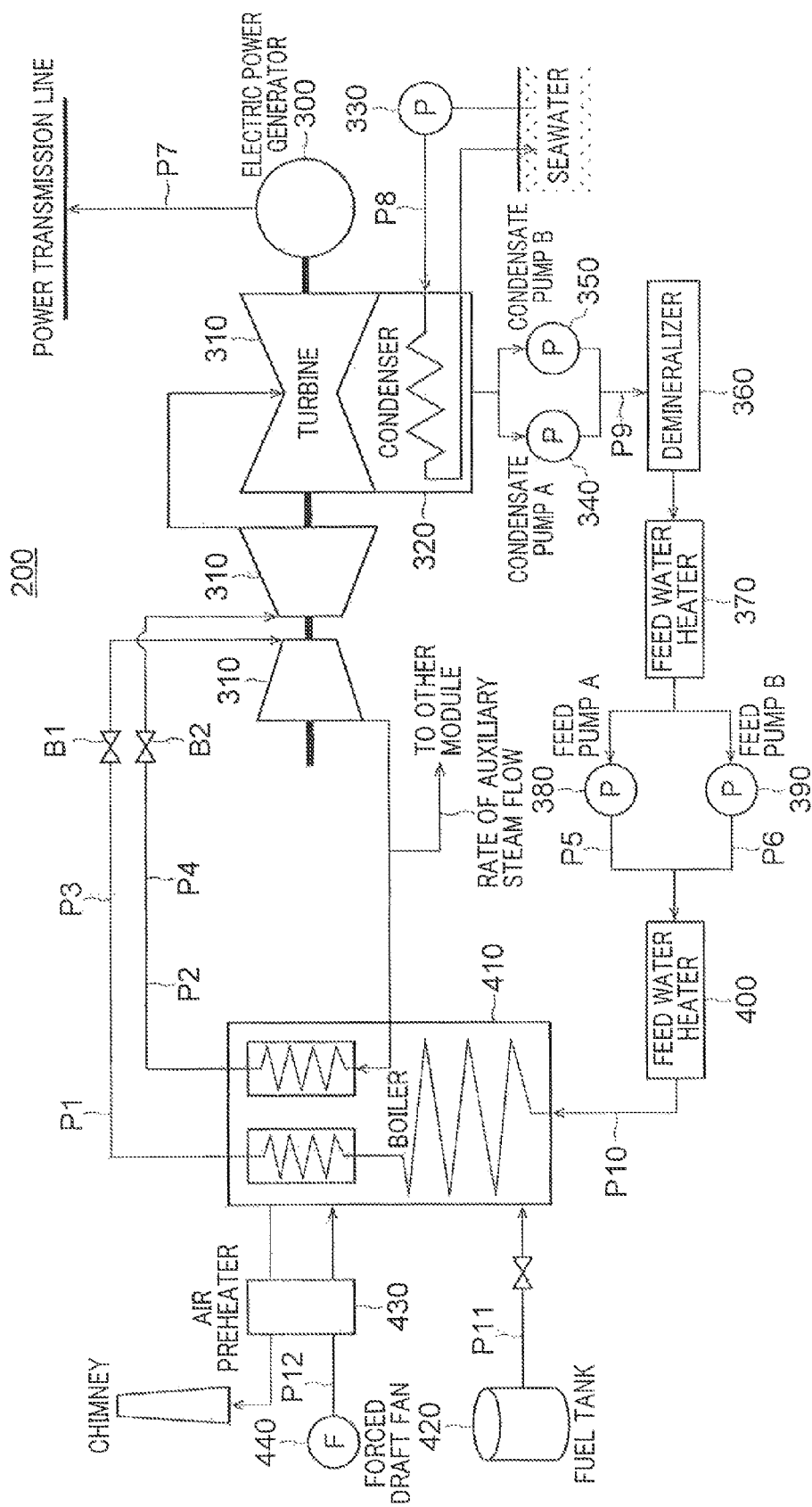
FIG. 1 is a diagram showing a configuration example of a plant 200.

The configuration of a plant monitoring system 100 in a first embodiment will be described with reference to FIGS. 1 to 23. FIG. 1 is a diagram showing a configuration example of a plant 200 that is monitored by the plant monitoring system 100.

First, the configuration example of the plant 200 and points will be described. The points are process quantity inputting points (e.g., abbreviated as PID) at each of which a measuring point is arranged, where a process quantity representing the state of a monitoring object is acquired. For example, at the points, sensors for acquiring process quantities that are to be monitoring object in the plant 200 are disposed. Alternatively, the process quantities are acquired from devices corresponding to the point. In addition, data items acquired from a plurality of points may the integrated into a new data item. In this case, the plurality of points are collectively referred to as one point.

In FIG. 1, the steam temperature of main steam that is heated by a boiler 410 is acquired by a sensor at P1, and the main steam pressure thereof is acquired by a sensor at a P3. In addition, the steam temperature of reheated steam that is heated by the boiler 410 is acquired by a sensor at P2, and the pressure of the reheated steam is acquired by a sensor at P4.

The main steam and the reheated steam are sent to a turbine 310 via valves B1 and B2. An electric power generator 300 generates electricity by means of the revolution of the turbine 310 that rotates using the energy from the main steam and the reheated steam. The amount of power generated by the electric power generator 300 is acquired by a sensor at a point P7. In addition, the temperature of cooling water in a pump 330, which supplies the cooling water to a condenser 320, is acquired by a sensor at a point P8. The rate of condensate flow that is discharged from a condensate pump A 340 and a condensate pump B 350, which are connected to this condenser 320 and connected in parallel to each other, is acquired by a sensor at P9.

In addition, the condensation that passes through a demineralizer 360 and a feed water heater 370 is fed to a feed water heater 400 via a feed pump A 380 and a feed pump B 390. The feed pump outlet pressures of these feed pump A 380 and feed pump B 390 are acquired by sensors at P5 and P6, respectively.

Hereafter, the term "process value" in the embodiments means a value based on an output value at a point in the plant. For example, a process value is a value obtained by subjecting an engineering unit value to signal processing, the engineering unit value being obtained by converting a process quantity acquired from a point using an EU (Engineering Unit) correcting function. The signal processing includes an adding process, a subtracting process, a difference process, a dividing process, a multiplying process, combinations thereof, and the like. For this reason, for example, a value that is obtained by subjecting an engineering unit value to noise reduction process is also treated to be a process value.

(Configuration)

Figure 2:
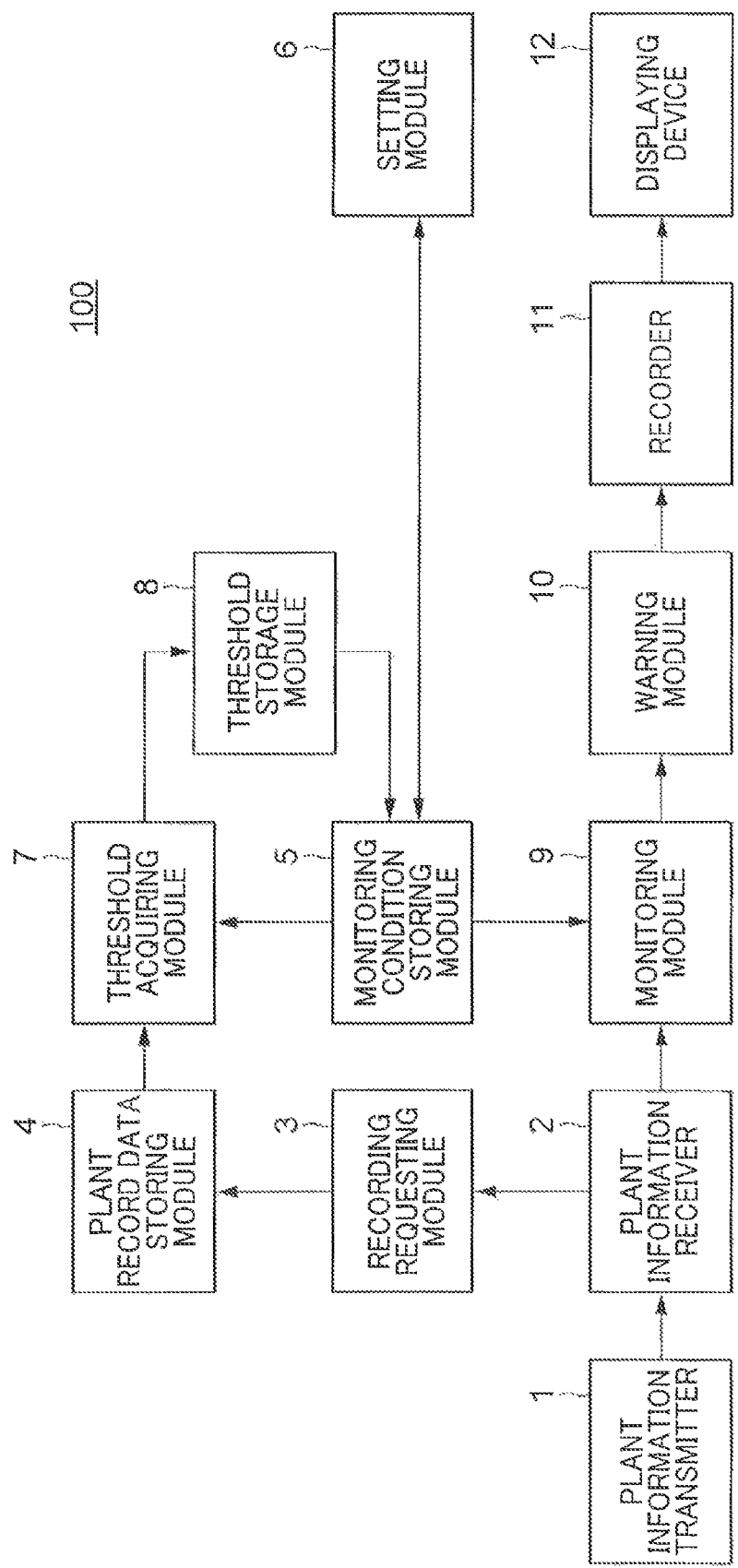
FIG. 2 is a block diagram showing a configuration example of the plant monitoring system 100 in the first embodiment.
Figure 3:
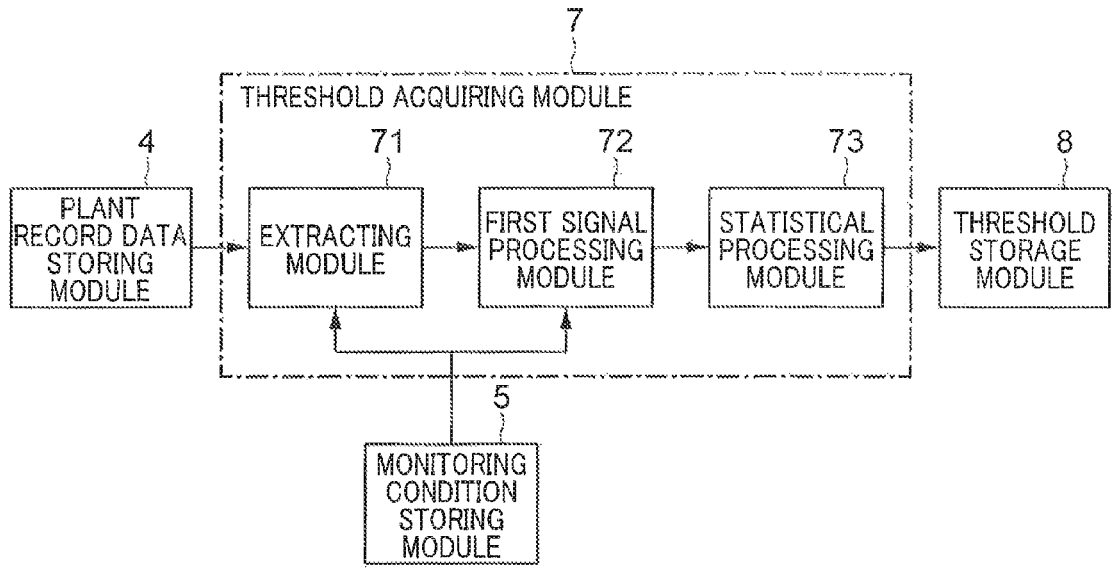
FIG. 3 is a diagram showing a detailed configuration example of a threshold acquiring module 7.
Figure 4:
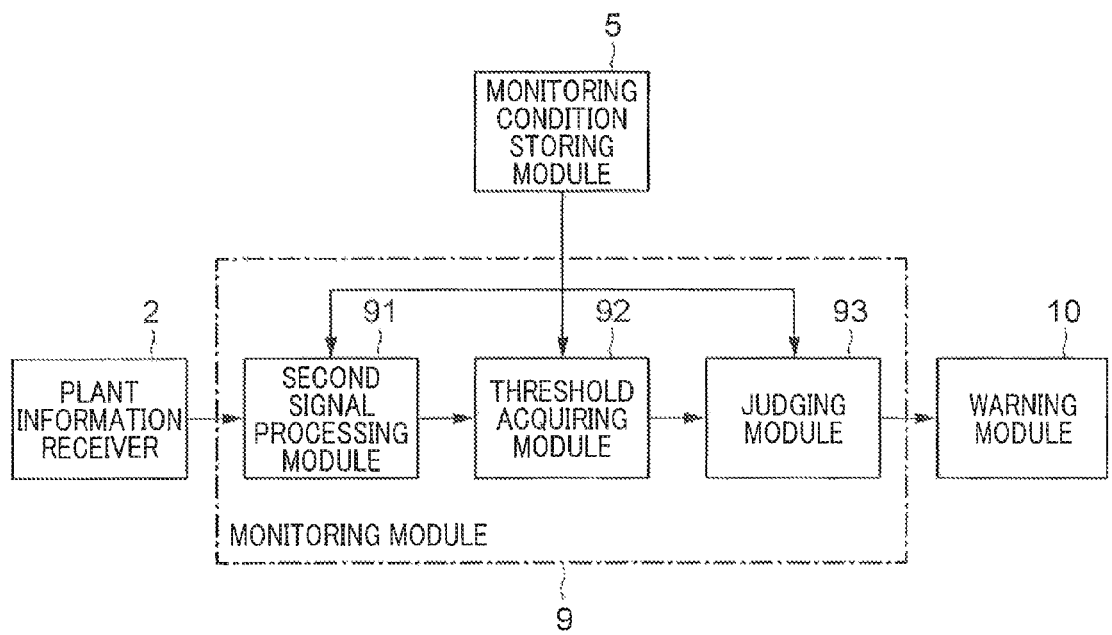
FIG. 4 is a diagram for illustrating a detailed configuration example of a monitoring module 9.

FIG. 2 is a block diagram showing a configuration example of the plant monitoring system 100 in the first embodiment. With reference to FIG. 2, the configuration of the plant monitoring system 100 in the present embodiment will be described. In this description, FIG. 3 and FIG. 4 are also referred to as appropriate.

The plant monitoring system 100 in the present embodiment includes a plant information transmitter 1, a plant information receiver 2, a recording requesting module 3, a plant record data storing module 4, a monitoring condition storing module 5, a setting module 6, a threshold acquiring module 7, a threshold storage module 8, a monitoring module 9, a warning module 10, a recorder 11, and the like.

The plant information transmitter 1 transmits in real time process values that are acquired at points in the plant 200, as time series data items. The plant information receiver 2 receives the transmitted process values, as time series data items. Next, the plant information receiver 2 outputs the received process values, as the time series data items, to the recording requesting module 3 and the monitoring module 9 that performs monitoring online.

The recording requesting module 3 outputs, for example, a recording request to collect and record input time series data on process values of the plant 200 as history data, to the plant record data storing module 4. The plant record data storing module 4 stores time series data on a plurality of process values for which the recording request is made from the recording requesting module 3 as plant record data.

The monitoring condition storing module 5 stores monitoring condition information. To this monitoring condition information, a condition is set under which the threshold acquiring module 7 calculates a threshold. In addition, a condition is set under which the monitoring module 9 monitors the process values.

The setting module 6 sets monitoring methods, monitoring parameters, and the like of monitoring items by means of a monitor, a keyboard, a mouse, and the like. The setting module 6 outputs the setting results thereof to the monitoring condition storing module 5, and the monitoring condition storing module 5 stores it as monitoring condition information.

FIG. 3 is a diagram showing a detailed configuration example of the threshold acquiring module 7.

The threshold acquiring module 7 calculates, in accordance with the monitoring condition information in the monitoring condition storing module 5, based on a value that is obtained by averaging the dispersion in process values corresponding to output values at a point in the monitoring object (e.g., reference value, average value) and a value that represents the dispersion (e.g., standard deviation), the first thresholds (first upper limit value and first lower limit value) that represents a first range of the dispersion in the process values, and the second thresholds (second upper limit value and second lower limit value) that represents a second range, which is a range wider than the first range in dispersion.

With reference to FIG. 3, the configuration of the threshold acquiring module 7 will be described. The threshold acquiring module 7 includes an extracting module 71, a first signal processing module 72, and a statistical processing module 73. The extracting module 71 extracts, from the plant record data storing module 4 in accordance with the monitoring information, history data on the monitoring object that has been acquired during a predetermined period and outputs the history data to the first signal processing module 72. The first signal processing module 72 performs a process of reducing noise from process values that are chronologically input. The statistical processing module 73 performs statistical processing on the process value subjected to signal processing to acquire (calculate) the first thresholds and the second thresholds.

Referring back to FIG. 2 again, the threshold storage module 8 stores information on the first thresholds and the second thresholds calculated by the threshold acquiring module 7.

FIG. 4 is a diagram for illustrating a detailed configuration example of the monitoring module 9.

The monitoring module 9 compares a process value acquired from a point in the monitoring object with the first thresholds and the second thresholds to judge whether the process value exceeds either the first thresholds or the second thresholds. The monitoring module 9 includes a second signal processing module 91, a threshold acquiring module 92, and a judging module 93.

The second signal processing module 91 performs, in accordance with the monitoring condition information in the monitoring condition storing module 5, signal processing under a condition similar to the condition under which the corresponding first thresholds and second thresholds are calculated. The second signal processing module 91 has a processing function, for example, as the combination of the extracting module 71 and the first signal processing module 72 because it performs signal processing under the same condition as that of the signal processing performed by the first signal processing module 72.

The threshold acquiring module 92 acquires the information on the first thresholds and the second thresholds to be stored in the threshold storage module 8. In addition, the threshold acquiring module 92 may calculate first thresholds and second thresholds corresponding to process values output from the second signal processing module 91 based on the acquired information on the first thresholds and the second thresholds.

The judging module 93 compares the process value output from the second signal processing module 91 with the first thresholds and the second thresholds corresponding to the process value that are acquired by the threshold acquiring module 92 to judge whether the process value exceeds either the first thresholds or the second thresholds.

Returning back to FIG. 2 again, the warning module 10 creates alert information based on the judgment result from the judging module 93. The recorder 11 records the alert information created by the warning module 10. The recorder (display controlling module) 11 records the alert information and causes the displaying device 12 to display an image based on the alert information to provide a notification to an operator.

(Action)

In FIG. 2, the plant information transmitter 1 receives process data, in real time, moment by moment, from points being process value detecting spots of one of various plants (e.g., P1 to P12 in FIG. 1). Then, the plant information transmitter 1 transmits, for example, a process value that is subjected to EU (Engineering Unit) conversion, as time series data.

Then, the plant information receiver 2 adds the identifier of a point called a PID or a TAG to data on each process value. The plant information receiver 2 adds information on the type, date and time, value, quality, and the like of data on process value and outputs the information to the recording requesting module 3 and the monitoring module 9.

The recording requesting module 3 outputs the received data on each process value to the plant record data storing module 4 as well as a recording request.

The plant record data storing module 4 adds information such as "per PID," "per type," and an order of time, and the like to the data on the process value and records the information as history data. The plant record data storing module 4 thereby stores at least time series data on process values acquired from points in the monitoring objects in the plant 200 and time series data necessary for processing by the first threshold acquiring module 7.

(1: Process of Extracting Data)

In FIG. 3, the extracting module 71 receives an extracting period for history data that is set to the monitoring condition in the monitoring condition storing module 5. Then, the history data, which is time series data on process values of a monitoring point, is extracted from the plant record data storing module 4. This extracting period is to be basic data used for calculating the threshold by the first threshold acquiring module 7 using statistical processing, which is specified by an operator.

As the extracting period, a period during which the operating state of the plant is in sound state is normally specified. In addition, a period of a predetermined operation mode may be specified. At the time of extracting the history data, data that satisfied an extracting condition set to the monitoring condition information is extracted. The extracting condition is defined in the form of presence/absence in the monitoring condition information in the monitoring condition storing module 5.

Figure 5:
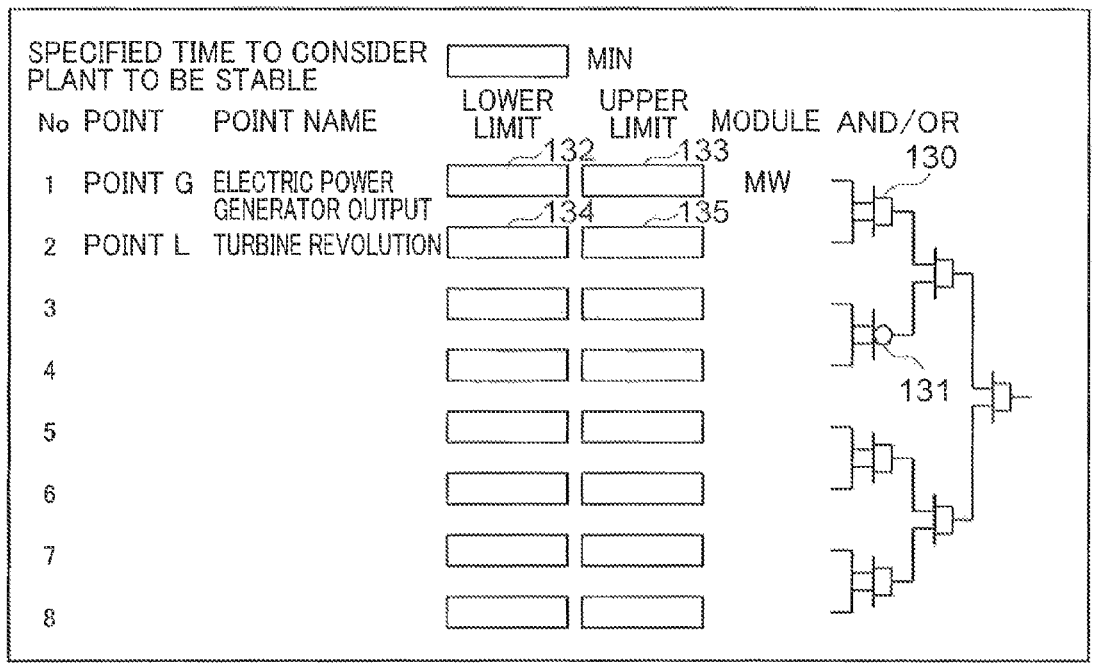
FIG. 5 is a diagram for illustrating an extracting condition set to monitoring condition information.

FIG. 5 is a diagram for illustrating the extracting condition set to the monitoring condition information. If "Yes" is set to the monitoring condition, a corresponding condition is acquired, as illustrated in FIG. 5. If "Yes" is set, the extracting module 71 extracts only data satisfying this condition from the plant record data storing module 4.

In the example of FIG. 5, conditions for outputs at points G and L are set to reference numerals 132 to 135. To the conditions, an AND process (130) and an OR process (131) of a plurality of points can be defined. This enables the acquisition of process values that conform to the state of the plant 200. For example, it is possible to acquire process values in the state where an electric power generator output is in a narrow range, or in the state where a turbine revolution is in a wide range by narrowing down the width between the lower limit 132 and the upper limit 133 while broadening the width between the lower limit 134 and the upper limit 135.

In contrast, when information is set to a column in which the AND process (130) is defined, the state of the plant can be further confined. For this reason, to extract only data in a predetermined operation mode, an operator sets a condition in a form illustrated in FIG. 5 via the setting module 6.

In addition, a long extracting period of data results in the extraction of a large amount of data, consuming many system resources. For this reason, the extracting module 71 extracts data during a period corresponding to a history data extracting cycle that is set to the monitoring condition information. If the cycle is automatically determined, a maximum cycle allowable to the system is automatically calculated. In contrast, if the cycle is fixed, data of a period allowable to the system is extracted from the plant record data storing module 4, using a cycle set to the monitoring condition information.

In addition, if the extracting condition is satisfied, the extracting module 71 outputs information (e.g., a numerical value 1) that represents that the condition is satisfied. In contrast, if the extracting condition is not satisfied, the extracting module 71 outputs information (e.g., a numerical value 0) that represents that the condition is not satisfied.

(2: Signal Processing)

FIGS. 6A to D are diagrams for illustrating processing methods by the first signal processing module 72 and the second signal processing module 91. The data extracted by the extracting module 71 is output to the first signal processing module 72. This causes the first signal processing module 72 to acquire a process value from a point in the monitoring object in the plant during a predetermined period. A signal processing method in the present embodiment will be described taking the example of the first signal processing module 72, but the signal processing by the second signal processing module 91 will not be described because the second signal processing module 91 performs a similar process.

Figure 6A:
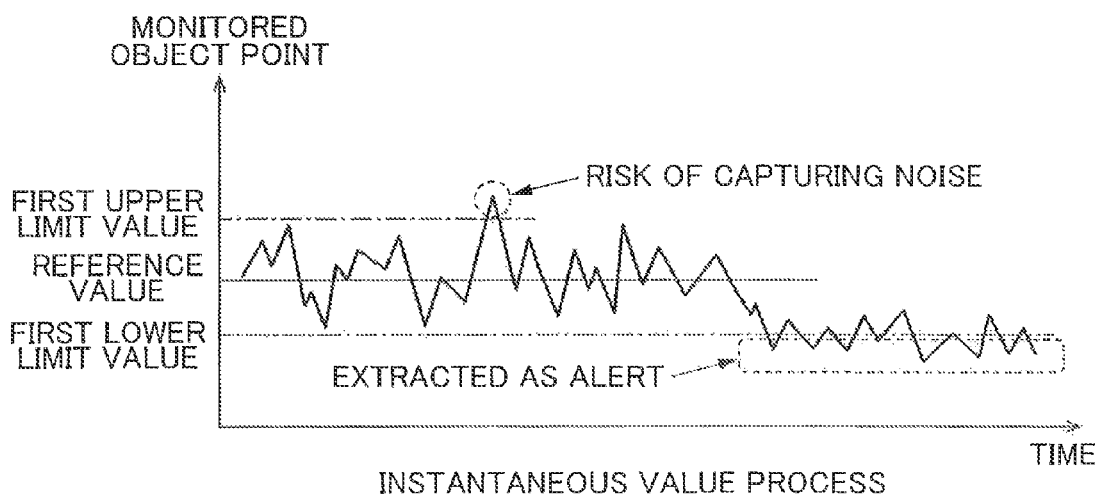
FIG. 6A is a diagram for illustrating an instantaneous value process.
Figure 6B:
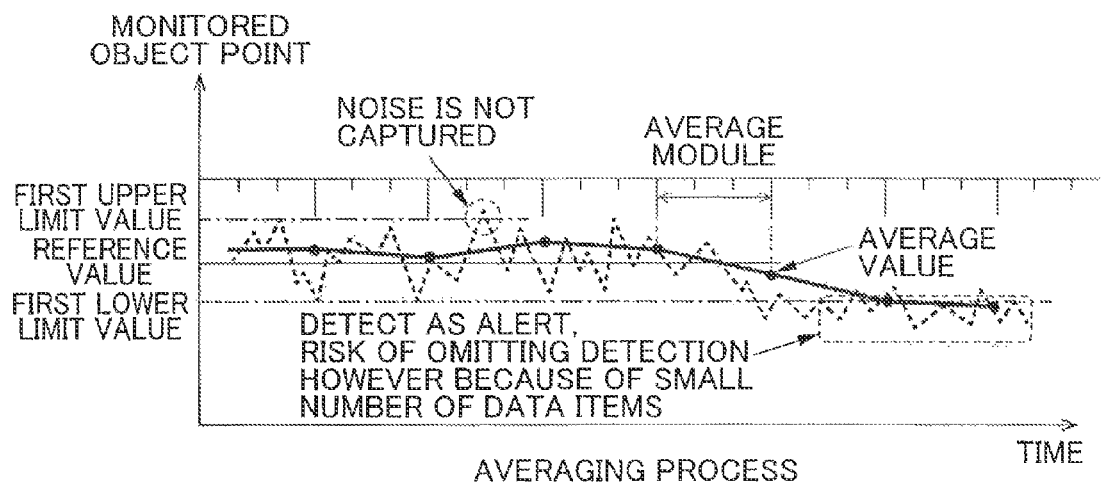
FIG. 6B is a diagram for illustrating an averaging process.

Then, the first signal processing module 72 performs a noise reduction process on history data being time series data on process values extracted during a period and at a cycle that are set to monitoring condition storing module 5 as the monitoring condition information (e.g., average section in FIG. 6B).

FIG. 6A is a diagram for illustrating an instantaneous value process.

In conventional monitoring plant devices, for example, as illustrated in FIG. 6A, monitoring is performed using an instantaneous value as the process value of a point to be monitored. For this reason, a monitoring method is to compare instantaneous process values of the point to be monitored with a threshold. It is often the case with this method where an instantaneous abrupt change in the process value (noise) is captured. For this reason, an erroneous alert may be issued. For this reason, the first signal processing module 72 performs a process of reducing noise from process values chronologically acquired from a point in the plant. However, some output values involve no noise occurring due to the characteristics of the points thereof in the monitoring object. In such a case, the first signal processing module 72 may output received data without performing the signal processing.

The signal processing for the noise reduction performed by first signal processing module 72 includes an averaging process, a moving average process, a conditioned moving average process, a filtering process, and the like. The first signal processing module 72 performs the signal processing in accordance with the monitoring condition information in the monitoring condition storing module 5.

(2.1: Averaging Process)

FIG. 6B is a diagram for illustrating the averaging process. The averaging process is performed on the time series data on the process values extracted at the cycle set to the monitoring condition information in the monitoring condition storing module 5. In such a manner, the averaging process is such that calculates an average value using process values during a predetermined time range, where an average value $\mu$ is calculated at predetermined time intervals.

(2.2: Moving Average Process)

Figure 6C:
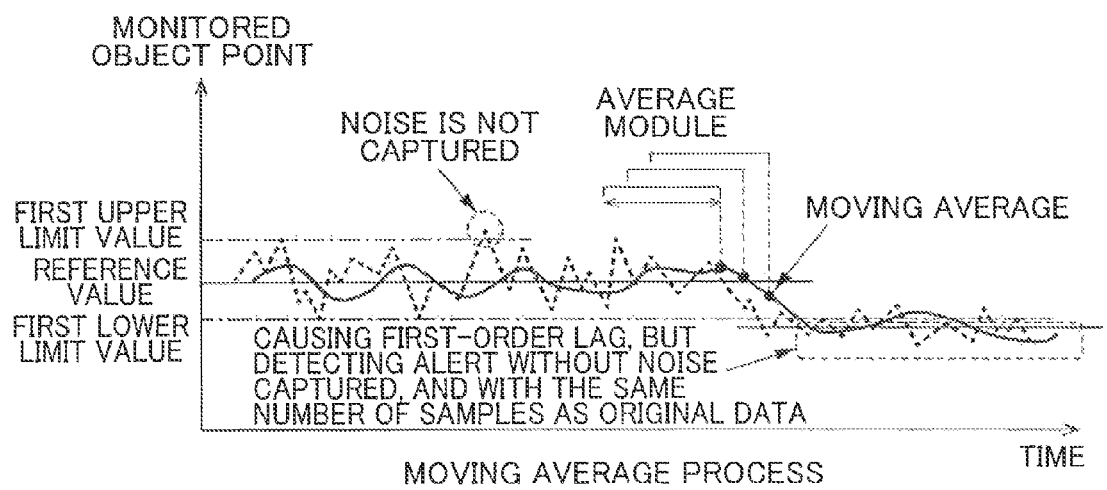
FIG. 6C is a diagram for illustrating a moving average process.

FIG. 6C is a diagram for illustrating the moving average process. The moving average process is performed at a cycle set to the monitoring condition storing module 5. In such a manner, the moving average process is such that calculates an average value $\mu$ using process values in a predetermined time range, where an average value is calculated for each process value.

(2.3: Conditioned Moving Average Process)

Figure 6D:
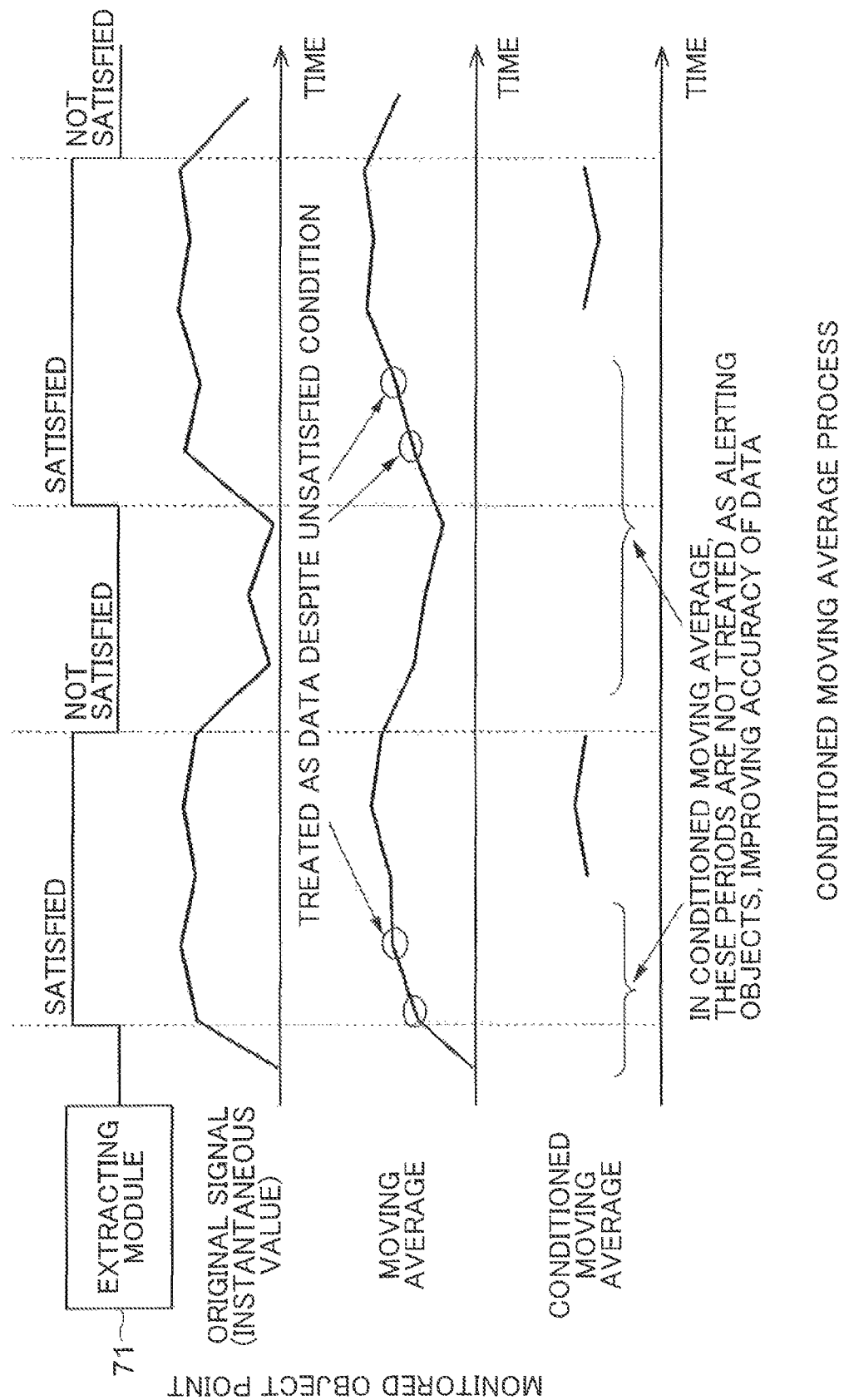
FIG. 6D is a diagram for illustrating a conditioned moving average process.

FIG. 6D is a diagram for illustrating the conditioned moving average process. In the conditioned moving average process, moving average is performed at a cycle specified by the monitoring condition storing module 5. In this case, data for the moving average is treated only if there are a number of valid data items in an average section, the number being specified by the monitoring condition storing module 5, or if there is no specified number of valid data items, such a case is treated as no data. For example, process values in the case where the output condition of the extracting module 71 is satisfied are to be subjected to the averaging process. In this case, for example, when the unsatisfied output condition of the extracting module 71 is changed to be satisfied, the averaging process is not performed because the number of data items to be subjected to the averaging process does not reach a number specified in the monitoring condition storing module 5.

In such a manner, the conditioned moving average process is such that calculates an average value using process values in a predetermined time range, and the average value is calculated if the number of data items in the predetermined time range exceeds a predetermined value.

The representative data processes are explained here, and these have an object to remove noise or specific components, and various kinds of data easy to detect may be created by incorporating a common filter such as a Butterworth filter.

In addition, in the present embodiment, the signal processing of process values is illustrated. After the determination of the threshold, the plant is to be monitored in accordance with the threshold. For this reason, the signal processing used for calculating the threshold is in the same scheme as that in signal processing for monitoring the plant. This scheme is defined in the monitoring condition information in the monitoring condition storing module 5. In such a manner, in the same scheme as that of the signal processing at the time of monitoring, the process values acquired from a point in the monitoring object are subjected to the averaging process, the moving average process, the conditioned moving average process, the filtering process, and the like. In such a manner, in the first signal processing module 72, the same data processing as that at the time of monitoring is performed also when the history data is extracted to calculate the threshold.

This enables the calculation of a threshold with which noise or an abruptly changed value is not detected at the time of monitoring. In addition, it is possible not to generate a difference in statistical processing between the case where the threshold is acquired in advance by the threshold acquiring module 7 and the case where the threshold is used at the time of monitoring by the monitoring module 9.

(3: Threshold)

Figure 7:
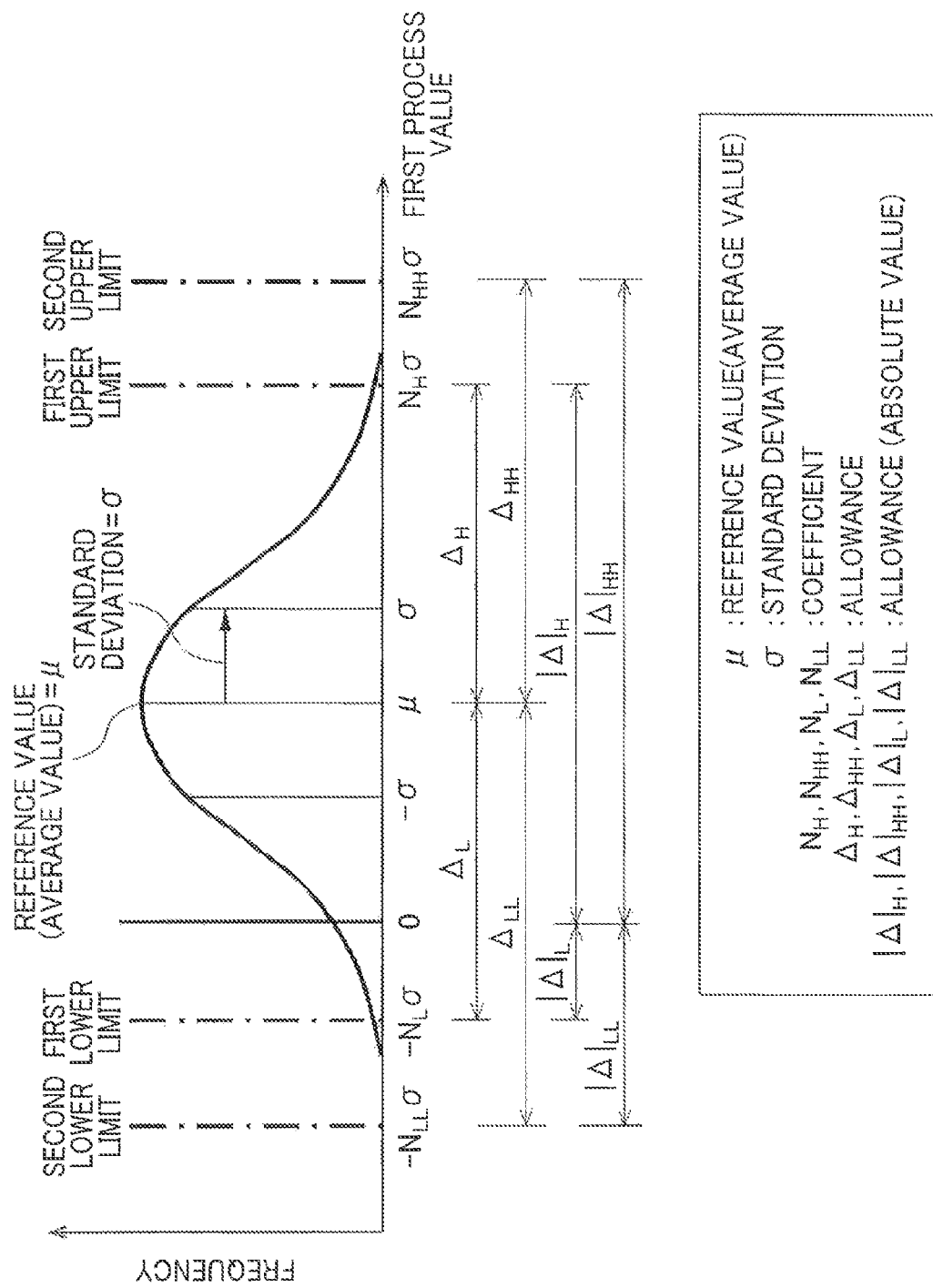
FIG. 7 is a diagram for illustrating the dispersion in process values of a monitoring object.

FIG. 7 is a diagram for illustrating the dispersion in process values of a monitoring object.

The statistical processing module 73 performs, for example, statistical processing on process values the noise of which is reduced by the first signal processing module 72, to calculate a threshold. For this purpose, the statistical processing module 73 performs the statistical processing on process values stored in the plant record data storing module 4.

As illustrated in FIG. 7, the process values have dispersion (e.g., distribution). The statistical processing module 73 performs the statistical processing on process values acquired from a point in a monitoring object during a predetermined period. For example, in the case of FIG. 7, the statistical processing module 73 acquires a value obtained by leveling the dispersion in the process values. For example, the average value $\mu$ of process values is calculated as a leveled value and make the average value $\mu$ a reference value.

Then, the statistical processing module 73 calculates a value that represents the dispersion in the process values. For example, the statistical processing module 73 calculates a standard deviation based on the reference value as the value representing the dispersion. A first upper limit value and a first lower limit value are calculated as first thresholds that represent a first range of the dispersion in the process values, the first upper limit value being a value obtained by adding, to the reference value, a value obtained by multiplying a standard deviation $\sigma$ by a first upper limit coefficient $N_H$, and the first lower limit value being a value obtained by adding, to the reference value, a value obtained by multiplying the standard deviation $\sigma$ by a first lower limit coefficient $N_L$.

Then, the statistical processing module 73 calculates a second upper limit value and a second lower limit value as second thresholds that represent a second range, which is wider than first range in dispersion, the second upper limit value being a value obtained by adding, to the reference value, a value obtained by multiplying the standard deviation $\sigma$ by a second upper limit coefficient $N_{HH}$, and the second lower limit value being a value obtained by adding, to the reference value, a value obtained by multiplying the standard deviation $\sigma$ by a second lower limit coefficient $N_{LL}$.

In such a manner, the statistical processing module 73 acquires in advance, based on a value obtained by leveling the dispersion in process values acquired in advance from a point in a monitoring object in the plant and a value representing the dispersion, the first thresholds that represent the first range of the dispersion in the process values and the second thresholds that represent the second range, which is wider than the first range in dispersion.

In the prior art, only the first upper limit value and the first lower limit value are used as thresholds. When the thresholds are provided as values being away from the average value by $n\sigma$ ($\sigma$: standard deviation), the difference between the thresholds is made larger by the dispersion in data. The large difference causes the thresholds to reach an alerting zone.

For this reason, there is a case where a sign or a precursor cannot be detected even when the first upper limit value and the first lower limit value are adjusted as the thresholds. In the present embodiment, it is possible to set an alert having an alerting zone using the second upper limit value and the second lower limit value and to detect a sign using the first upper limit value and the first lower limit value. It is thereby possible to enhance the accuracy of state monitoring for a plant.

The occurrence frequency of a process value has a correlation with the state of a point at which the process value is acquired. For this reason, by adjusting the first thresholds and the second thresholds, it is possible not only to monitor the state of a point that reaches the alerting zone but also to monitor the state of a sign or a precursor before reaching the alerting zone.

(3.1: Correlation Monitoring (First Process))

Figure 8:
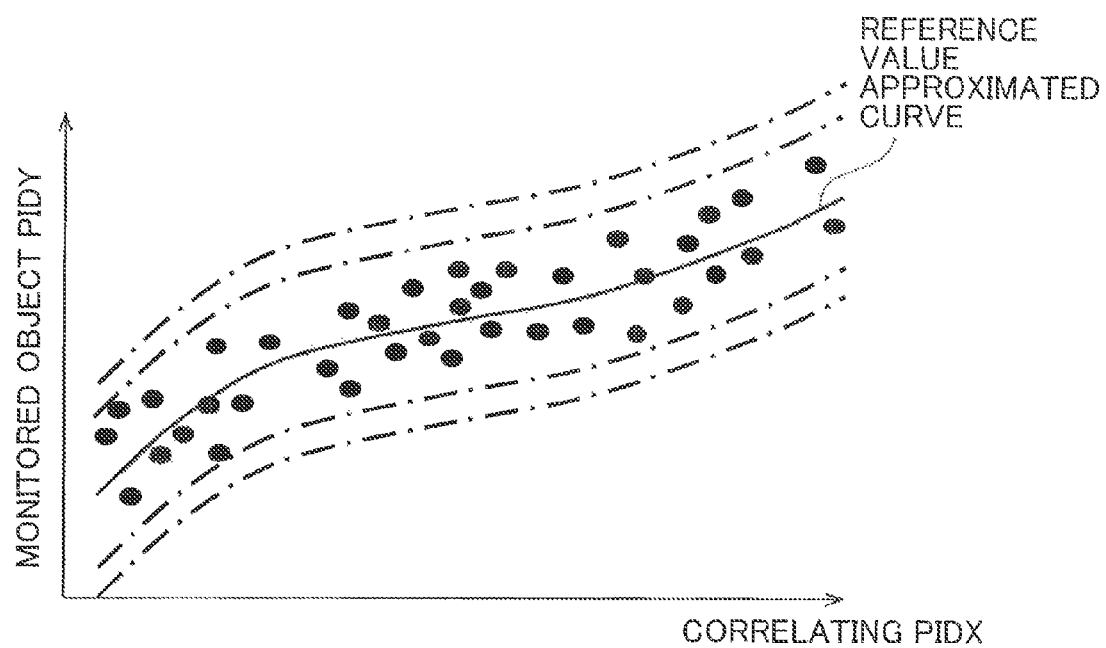
FIG. 8 is a diagram for illustrating thresholds for correlation monitoring.

FIG. 8 is a diagram for illustrating thresholds for correlation monitoring. FIG. 8 shows the case where statistical processing is performed on a monitored object PIDY with respect to a correlating PIDX over the entire range to calculate a reference value approximated curve.

The relationship between first process values (Y) acquired from a first point of a monitoring object (the monitored object PIDY) and second process values (X) acquired from a second point (the correlating PIDX) different from the first point is illustrated. Output values of the first point have a correlation with output values acquired from the second point in normal operation. The statistical processing module 73 receives the first process values (Y) and the second process values (X) the noise of which is reduced by the first signal processing module 72. In such a manner, in the correlation monitoring (first process), the process values acquired from the first point of the monitoring object is treated as the first process values.

When the correlation monitoring is set to the monitoring condition information in the monitoring condition storing module 5, the statistical processing module 73 calculates reference values based on the average value of the first process values corresponding to second process values that is acquired from the second point, and the standard deviation of the first process values based on reference values. The statistical processing module 73, for example, equally divides the second process values, and calculates the average values $\mu$ of the first process values within the respective ranges. This average values $\mu$ are, for example, fitted to an approximate polynomial curve to acquire the reference value approximated curve. Values acquired based on the reference value approximated curve are the reference values.

Then, based on difference values between the first process values (Y) and the reference values acquired from the corresponding reference value approximated curve, the standard deviation is calculated. The statistical processing module 73 calculates a first upper limit value and a first lower limit value as the first thresholds, the first upper limit value being a value obtained by adding, to the reference value, a value obtained by multiplying the standard deviation by the first upper limit coefficient, and the first lower limit value being a value obtained by adding, to the reference value, a value obtained by multiplying the standard deviation by the first lower limit coefficient.

The first thresholds are shown by dash-dot lines closer to the reference value approximated curve in FIG. 8. A range between the first thresholds is the first range. In addition, by fitting the values of the first thresholds to an approximate polynomial curve, the first thresholds may be calculated using the polynomial based on the second process values (X).

The statistical processing module 73 calculates a second upper limit value and a second lower limit value as the second thresholds, the second upper limit value being a value obtained by adding, to the reference value, a value obtained by multiplying the standard deviation by the second upper limit coefficient, and the second lower limit value being a value obtained by adding, to the reference value, a value obtained by multiplying the standard deviation by the second lower limit coefficient. A range between the second thresholds is the second range. In addition, by fitting the values of the second thresholds to, for example, an approximate polynomial curve, the second process values may be calculated using the polynomial based on the first thresholds (Y).

The statistical processing module 73 sets these pieces of information to the monitoring condition information in the monitoring condition storing module 5 via the threshold storage module 8. The statistical processing module 73 acquired the first thresholds and the second thresholds based on the value of the standard deviation. For this reason, it is possible to adjust a statistical frequency at which a first process value deviates from the first range and a statistical frequency at which the first process value deviates from the second range, with respect to a corresponding second process value. For this reason, by adjusting the first range and the second range, it is possible not only to monitor the state of a point reaching the alerting zone but also to monitor the state of a sign or a precursor before reaching the alerting zone.

(3.1.1: Zone Correlation Monitoring)

Figure 9:
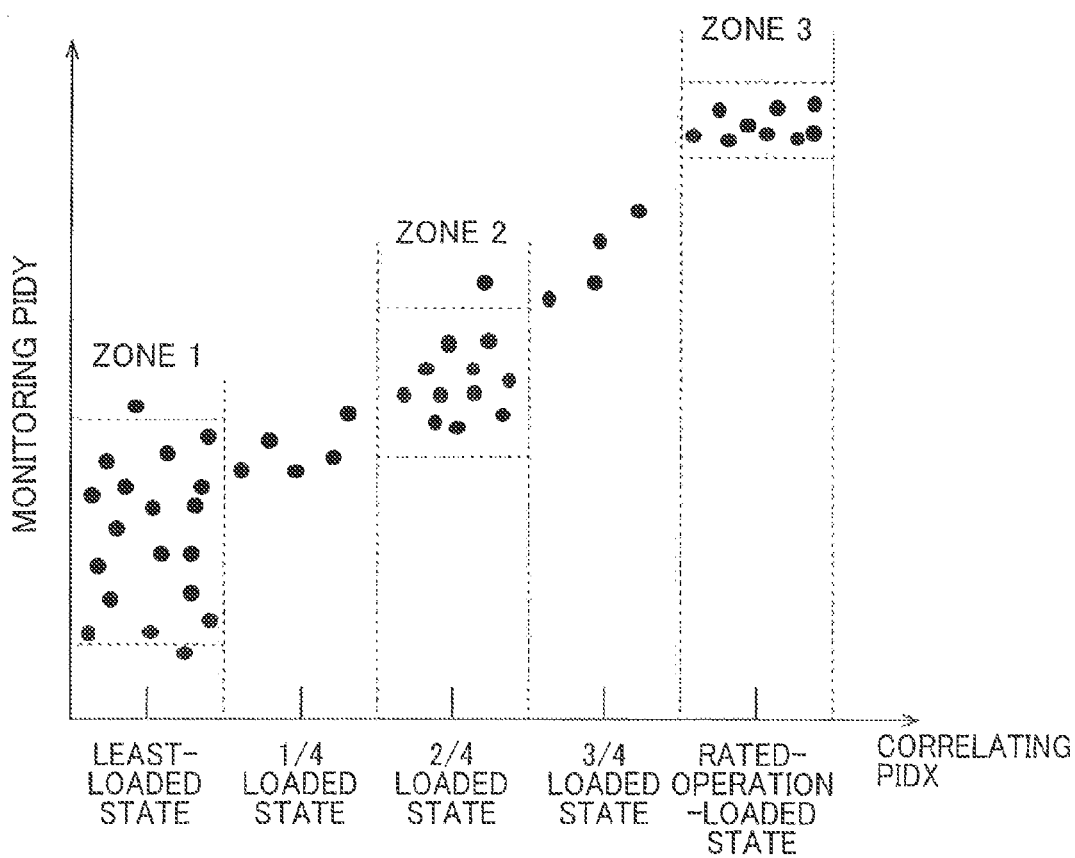
FIG. 9 is a diagram for illustrating the case where the distribution in process values is unbalanced.
Figure 10:
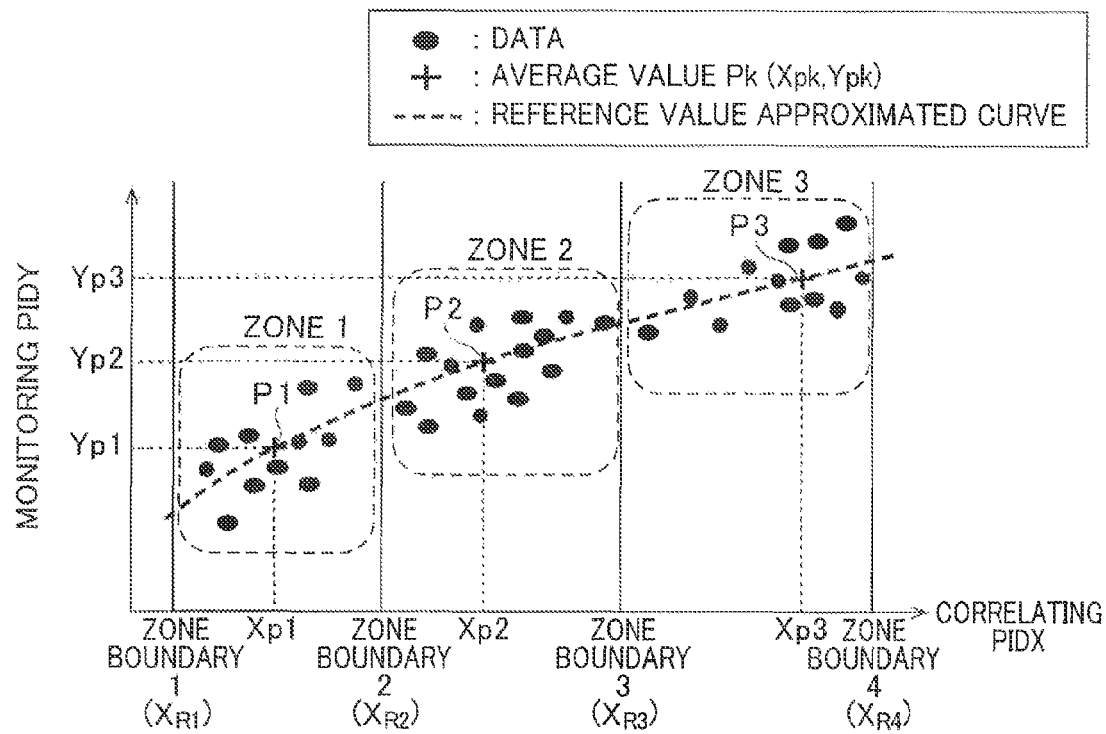
FIG. 10 is a diagram for illustrating thresholds for zone correlation monitoring.

FIG. 9 is a diagram for illustrating the case where the distribution of process values is unbalanced. FIG. 10 is a diagram for illustrating thresholds for zone correlation monitoring. The statistical processing module 73 divides the values of the second process values into a plurality of ranges, and calculates a reference value approximated curve, first thresholds, and second thresholds independently for each range.

Due to the characteristics of a plant, it is seldom the case that data distributes uniformly over the entire range. For this reason, it is often the case that a distribution is unbalanced. Taking such a matter into consideration, a technique of dividing the entire range into some clusters, adjusting the width of thresholds using weight coefficients of a monitoring object for each cluster to calculate general thresholds, has been used.

However, there is a case where a distribution is extremely unbalanced and concentrated due to the operating state/operating manner of a plant. FIG. 9 is a diagram for illustrating the case where the distribution of process values is unbalanced. Data items may be concentrated on a certain region or the distribution of data may be wider. For this reason, there is a case where proper thresholds cannot be calculated only by correction with weight coefficients.

It is necessary to properly monitor process values of a monitoring object having such characteristics. For this reason, the statistical processing module 73 divides the values of the correlating PIDX, that is, the horizontal axis into an arbitrary number of zones. The width of a zone by which the statistical processing module 73 divides the values of the second process values into a plurality of ranges is set to the monitoring condition information in the monitoring condition storing module 5. The statistical processing module 73 divides the horizontal axis into regions having the width of a zone that is set to the monitoring condition information.

In addition, in the monitoring condition information in the monitoring condition storing module 5, the correlating PIDX and the number thereof, the degree of an approximate expression of thresholds for each zone, and the like are defined.

Figure 11:
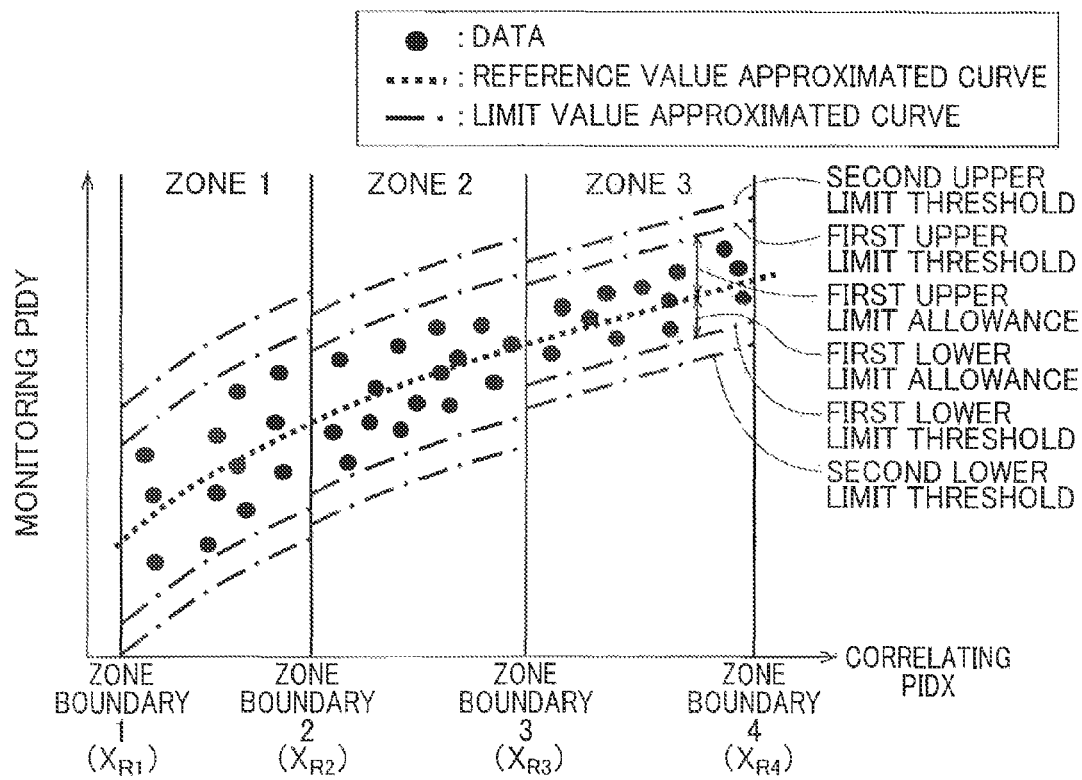
FIG. 11 is diagram for illustrating thresholds for each zone.

FIG. 11 is diagram for illustrating thresholds for each zone.

The statistical processing module 73 calculates, for example, the thresholds of the nth degree polynomial for each zone as shown in FIG. 11. In such a manner, a reference value approximated curve, first thresholds, and second thresholds are calculated for each zone. First thresholds are a first upper limit value and a first lower limit value, which are used in the judging module 93 as a first upper limit threshold and a first lower limit threshold. In addition, second thresholds are a second upper limit value and a second lower limit value, which are used in the judging module 93 as a second upper limit threshold and a second lower limit threshold. The statistical processing module 73 sets these pieces of information to the monitoring condition information in the monitoring condition storing module 5 via the threshold storage module 8.

This enables monitoring with thresholds corresponding to the degree of dispersion for each zone. In addition, since the width of zones can be freely changed, thresholds suitable for the characteristics of the monitored object PIDY can be taken. For this reason, it is possible to monitor monitoring items that have never been monitored.

In addition, at the time of specifying the first upper limit values, the first lower limit value, the second upper limit value, and the second lower limit value, values being away from the reference value (average value) by $n\sigma$ ($\sigma$: standard deviation) may be used as thresholds. In addition, in the present embodiment, at the time of specifying the first upper limit value, the first lower limit value, the second upper limit value, and the second lower limit value, using engineering unit values for the specification is enabled. There is a case where an operator who performs manipulation cannot grasp the thresholds intuitively only based on the standard deviation $\sigma$. For this reason, enabling the specification using engineering unit values makes the manipulating operator to easily grasp thresholds. For example, the first upper limit value, the first lower limit value, the second upper limit value, and the second lower limit value may be specified using a value such as a first upper limit coefficient that represents dispersion from standard deviation. For example, the first upper limit value, the first lower limit value, the second upper limit value, and the second lower limit value may be specified using engineering unit values.

If using engineering unit values is specified to the monitoring condition information, the statistical processing module 73 can calculate, based on the average value µ the first upper limit value, the first lower limit value, the second upper limit value, the second lower limit value that are specified using engineering unit values. For this reason, since the operator can easily grasp the thresholds, it is possible to properly set the thresholds to monitoring items.

(3.1.2: Correlation Three-Dimensional Monitoring)

Next, correlation three-dimensional monitoring will be described. A correlating PID 1 and a correlating PID 2 are provided with respect to the monitored object PIDY, and thresholds are calculated and set making use of correlativity. For example, for some monitored objects PIDY, there is a case where the accuracy of judgment can be improved by providing further one correlating PID. It is thereby possible to bring out the characteristics of the monitored object PID to provide proper thresholds. For example, process values relating to a gas turbine in a combined power plant has a high correlation with an electric power generator output. In addition, the process values relating to a gas turbine also has a high correlation with an ambient temperature. For this reason, for the process values relating to a gas turbine, the accuracy of judgment can be improved by calculating the thresholds using the electric power generator output and the ambient temperature as the correlating PIDs. In such a manner, for some points, three-dimensional correlation monitoring using two correlating PIDs can bring out better characteristics and perform effective monitoring.

Figure 12:
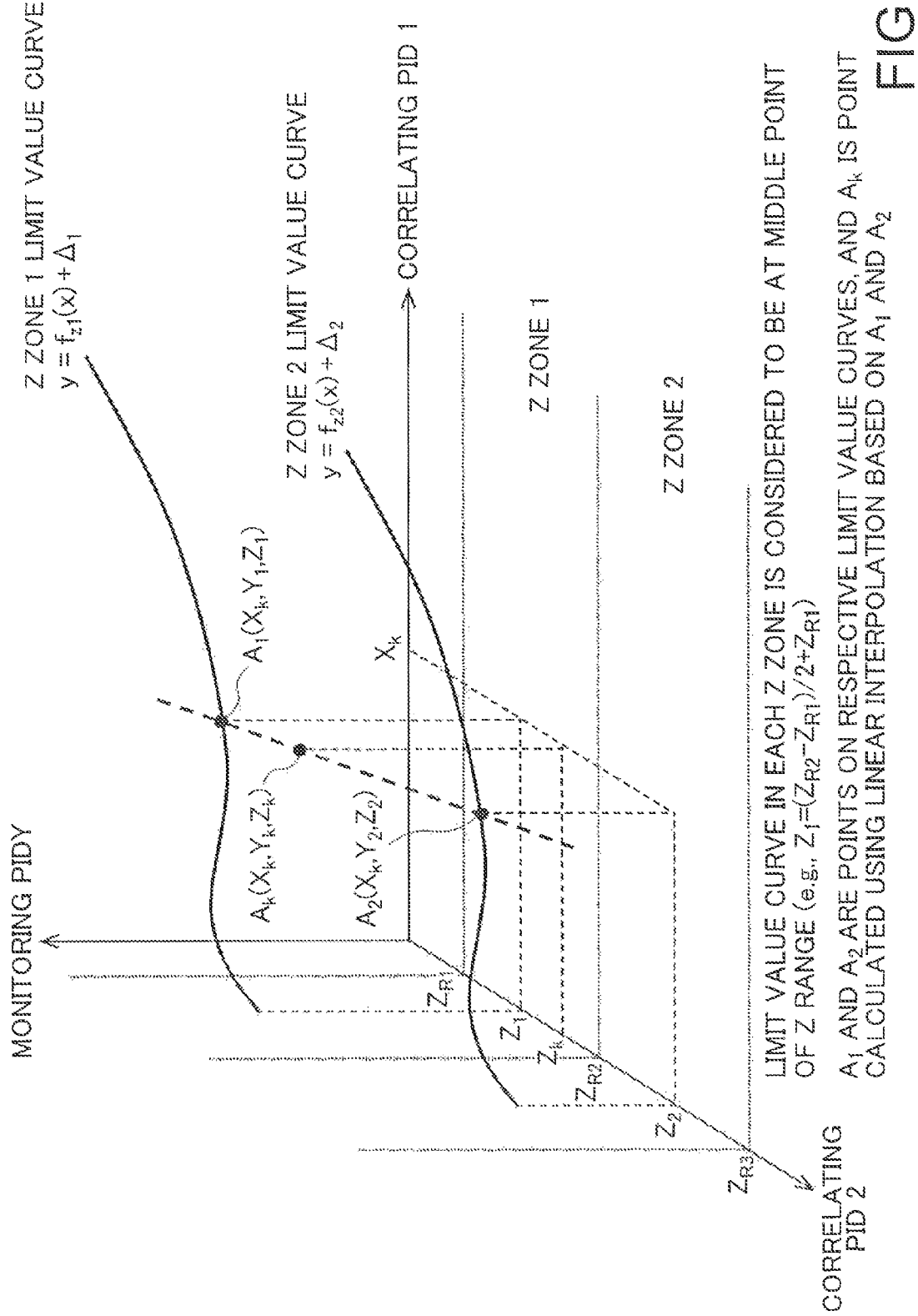
FIG. 12 is a diagram for illustrating correlation three-dimensional monitoring.

FIG. 12 is a diagram for illustrating the correlation three-dimensional monitoring.

The statistical processing module 73 receives the monitoring condition information from the monitoring condition storing module 5. In the statistical processing module 73, it is assumed, in accordance with the monitoring condition information, that the output value of the monitored object PIDY is a Y axis, the output value of the correlating PID 1 is an X axis, and the output value of the correlating PID 2 is a Z-axis. As shown in FIG. 12, the division into zones is also performed in a Z-axis direction, and interpolating calculation is performed in accordance with the width of zone to calculate a reference value, and thresholds (a first upper limit value, a first lower limit value, a second upper limit value, and a second lower limit value) are acquired through statistical processing. The result thereof is set to the monitoring condition information in the monitoring condition storing module 5 via the threshold storage module 8. Although FIG. 12 shows the three-dimensional example, the dimensions can be added by the same technique such as four dimensions and five dimensions.

In such a manner, by calculating thresholds that have been calculated using the correlation with one PID using correlation among a plurality of PIDs, it is possible to perform monitoring using thresholds that matches the characteristics of the monitored object PID. For this reason, monitoring items that have been unable to be monitored are allowed to be monitored effectively. It is thereby possible to improve the accuracy of state monitoring for a plant.

(3.2: Chronological Process Value Monitoring (Second Process))

Figure 13:
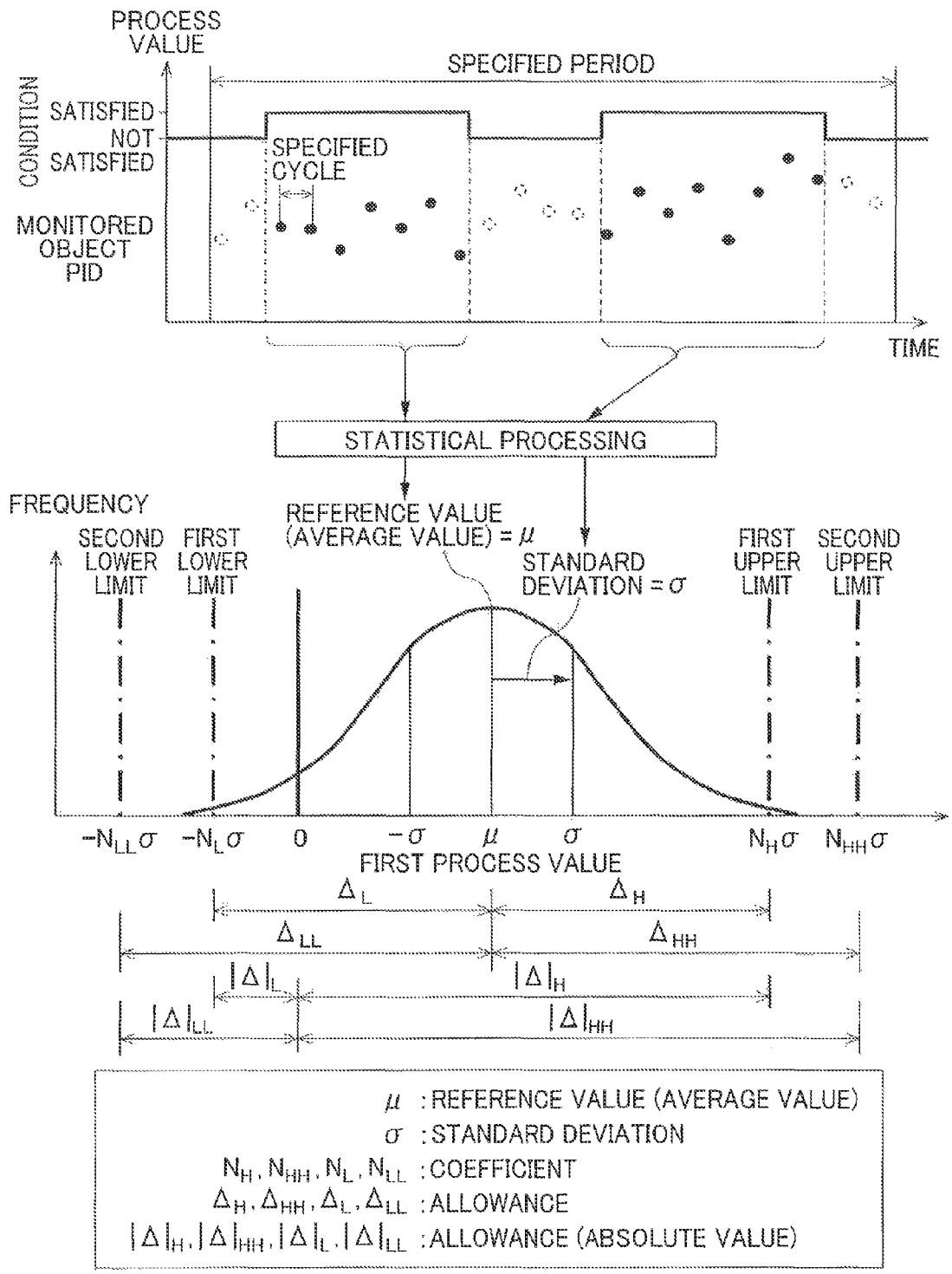
FIG. 13 is a diagram for illustrating second statistical processing in the case where chronological process value monitoring is performed.

Next, chronological process value monitoring will be described. FIG. 13 is a diagram for illustrating second statistical processing in the case where the chronological process value monitoring is performed. In conventional practice, thresholds are calculated based on a correlating PID having a correlation with the monitored object PID. However, in an actual plant, there is a case where there is no PID having such a correlation, or a case where a correlation is too weak to representing the characteristics of the monitored object PID.

For this reason, in the present embodiment, the chronological process value monitoring is provided as a second process for such a monitored object PID. This is a process in the case where the chronological process value monitoring is set to the monitoring condition information in the monitoring condition storing module 5. In this case, the statistical processing module 73 performs a difference process on process values that are chronologically acquired from a first point in the monitoring object at predetermined time intervals (e.g., at a specified cycle in FIG. 13) to calculate a difference value. In such a manner, the method of the second process is to calculate the difference value between a process value that is acquired from the first point and a process value that is acquired from the first point a predetermined time after a point in time when this process value is acquired, as a first process value.

Next, the statistical processing module 73 calculates, as a value obtained by leveling dispersion, for example, an average value µ of the first process values as a reference value. Next, as a value representing the dispersion, for example, a standard deviation σ based on the reference value is calculated. The statistical processing module 73 calculates a first upper limit value and a first lower limit value as first thresholds, the first upper limit value being a value obtained by adding, to the reference value, a value obtained by multiplying the standard deviation σ by a first upper limit coefficient $N_H$, and the first lower limit value being a value obtained by adding, to the reference value, a value obtained by multiplying the standard deviation σ by a first lower limit coefficient $N_L$.

Then, the statistical processing module 73 calculates a second upper limit value and a second lower limit value as second thresholds, the second upper limit value being a value obtained by adding, to the reference value, a value obtained by multiplying the standard deviation σ by a second upper limit coefficient $N_{HH}$, the second lower limit value being a value obtained by adding, to the reference value, a value obtained by multiplying the standard deviation σ by a second lower limit coefficient $N_{LL}$.

In such a manner, the chronological process value monitoring is such that subjects chronological variations to statistical processing to calculates the thresholds without specifying a correlating PID. After data is extracted by the extracting module 71 and subjected to data processing by the first signal processing module 72, if the chronological process value monitoring is set to the monitoring condition information in the monitoring condition storing module 5, the statistical processing module 73 performs the statistical processing on data as chronological data to calculate the thresholds (a first upper limit value, a first lower limit value, a second upper limit value, and a second lower limit value). The thresholds calculated in such a manner are set to the monitoring condition information in the monitoring condition storing module 5 via the threshold storage module 8. In such a manner, it is possible to calculate the thresholds of chronological process data for a monitored object PID having no correlating PID or a monitored object PID that has a weak correlation. For this reason, effective monitoring can be performed on monitoring items that have been unable to be monitored using the correlation monitoring. It is thereby possible to improve the accuracy of the state monitoring for a plant.

(3.3: Chronological Change Rate Monitoring (Third Process))

Figure 14:
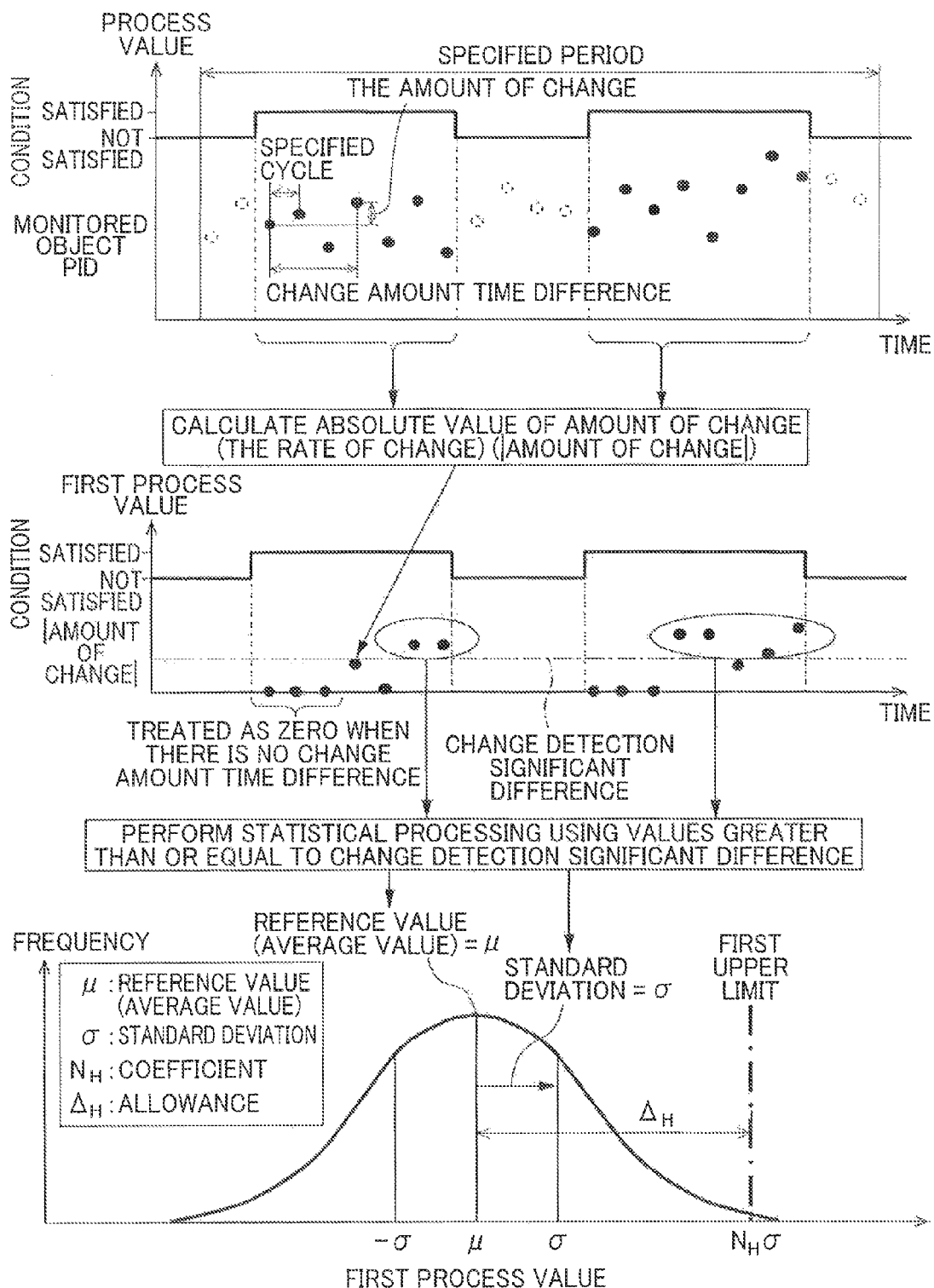
FIG. 14 is a diagram for illustrating third statistical processing in the case where chronological change rate monitoring is performed.

Next, chronological change rate monitoring will be described. FIG. 14 is a diagram for illustrating third statistical processing in the case where the chronological change rate monitoring is performed.

Some PIDs to be monitored provides process values each of which enables capturing anomalies by monitoring the rate of change in the process value to perform threshold monitoring on the rate of change. For example, the consuming ratio of the lifetime of a device, a discharge amount integrated value, or the like substantially increases with a constant rate in regular operation. Such a process value cannot be subjected to the threshold monitoring with the correlation monitoring or the chronological process value monitoring, and monitoring the rate of change is effective. For such a monitored object PID, in the present embodiment, the chronological change rate monitoring is provided.

The chronological change rate monitoring does not specify a correlating PID but performs statistical processing on the rate of chronological change to calculate thresholds. When the chronological change rate monitoring is set to the monitoring condition information in the monitoring condition storing module 5, the statistical processing module 73 performs, for example, a difference process on process values that are chronologically acquired from a first point in a monitoring object at predetermined time intervals (e.g., change amount time difference in FIG. 14) to calculate the difference value. Next, the statistical processing module 73 acquires the absolute value of a value obtained by dividing the difference value by the time interval.

In such a manner, the method of the third process is to calculate the absolute value of a value obtained by dividing the difference value between a process value that is acquired from a first point in a monitoring object and a process value that is acquired from the first point in the monitoring object a predetermined time after a point in time when this process value is acquired, by the corresponding time interval, as a first process value.

A process of calculating the thresholds is the same process as that of the chronological process value monitoring and will not be described. In such a manner, after data is extracted by the extracting module 71 and subjected to data processing by the first signal processing module 72, the statistical processing module 73 calculates the rate of change in data in accordance with the monitoring condition information in the monitoring condition storing module 5. Statistical processing is performed on the value of this rate of change is as the chronological data to calculate the thresholds (a first upper limit value, a first lower limit value, a second upper limit value, and a second lower limit value). The statistical processing module 73 inputs the thresholds into the monitoring condition storing module 5 via the threshold storage module 8 and set it to the monitoring condition information.

In such a manner, the calculation of the thresholds of the rate of chronological change can be performed for a monitored object PID that is characteristic in the rate of change, and it is thus possible to perform monitoring as with the chronological process value monitoring. For this reason, effective monitoring can be performed on monitoring items that have been unable to be monitored using the correlation monitoring. It is thereby possible to improve the accuracy of the state monitoring for a plant.

(3.4: Chronological Deviation Monitoring (Fourth Process))

Figure 15:
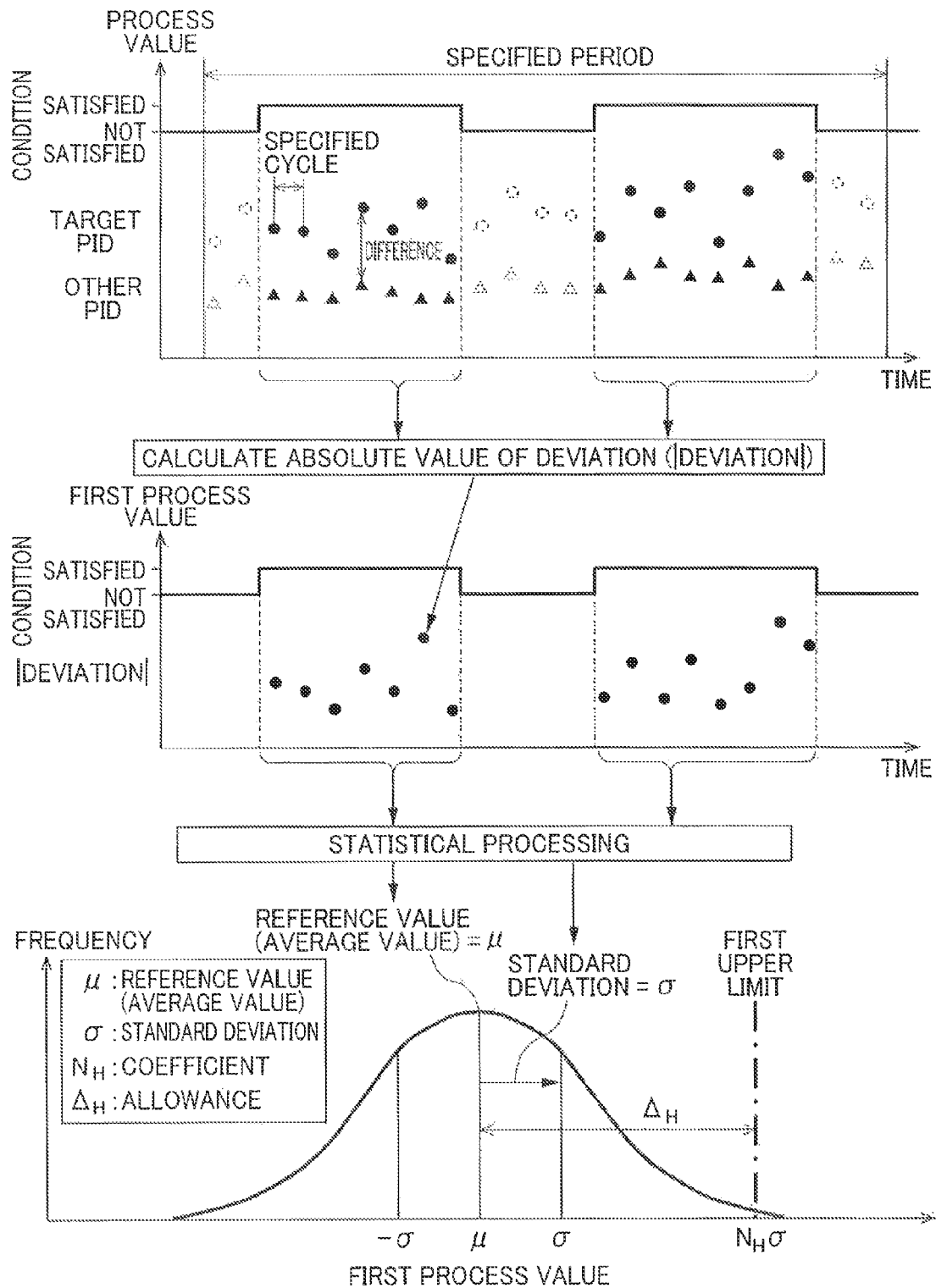
FIG. 15 is a diagram for illustrating fourth statistical processing in the case where chronological deviation monitoring is performed.

Next, chronological deviation monitoring will be described. FIG. 15 is a diagram for illustrating fourth statistical processing in the case where the chronological deviation monitoring is performed.

Some PID to be monitored provides process values each of which enables capturing anomalies by monitoring the deviation of the process value from the other process value to perform threshold monitoring on the deviation. For example, an inlet temperature and an outlet temperature, an inlet pressure and an outlet pressure, and the like are likely to be characteristic in a deviation between both of the values. Such process values cannot be subjected to the threshold monitoring using the correlation monitoring or the chronological process value monitoring, but it is effective to monitor the deviation between the process values of an inlet and an outlet. For such a monitored object ND, in the present embodiment, the chronological deviation monitoring is provided.

The chronological deviation monitoring does not specify a correlating PID but performs statistical processing on chronological deviations to calculate thresholds. When the chronological deviation monitoring is set to the monitoring condition information in the monitoring condition storing module 5, the statistical processing module 73 performs the statistical processing on the relationship between a process value acquired from a first point and a process value acquired from a third point different from the first point. The statistical processing module 73 calculates the absolute values of the differences between process values that are chronologically acquired from the first point and process values that are chronologically acquired from the corresponding third point.

In such a manner, the method of a fourth processing is to calculate the absolute value of the difference between a first process value that is acquired from the first point and a third process value that is acquired from the third point at a time point corresponding to a time point when the first process value is acquired, as a first process value.

A process of calculating the thresholds is the same process as that of the chronological process value monitoring and will not be described. In such a manner, after data is extracted by the extracting module 71 and subjected to data processing by the first signal processing module 72, if the chronological deviation monitoring is specified to the monitoring condition information in the monitoring condition storing module 5, the statistical processing module 73 calculates the deviations between the data items of the monitored object PID and a PID for calculating the deviation and performs the statistical processing on the values of these deviations as chronological data to calculate the thresholds (a first upper limit value, a first lower limit value, a second upper limit value, and a second lower limit value). The thresholds calculated in such a manner are input into the monitoring condition storing module 5 via the storage module 8 and set to the monitoring condition information.

In such a manner, thresholds with respect to chronological deviations can be calculated for a monitored object PID that is characteristic in deviation, and it is possible to perform monitoring as with the chronological process value monitoring. For this reason, effective monitoring can be performed on monitoring items that have been unable to be monitored using the correlation monitoring. It is thereby possible to improve the accuracy of the state monitoring for a plant.

As described above, the statistical processing module 73 performs one of the first to fourth statistical processing based on the monitoring information. The thresholds are calculated by the statistical processing module 73 are sent to the threshold storage module 8 and stored as thresholds. In addition, the thresholds are set to the monitoring condition information in the monitoring condition storing module 5 from the threshold storage module 8.

(4: Dialog Screen)

Figure 17:
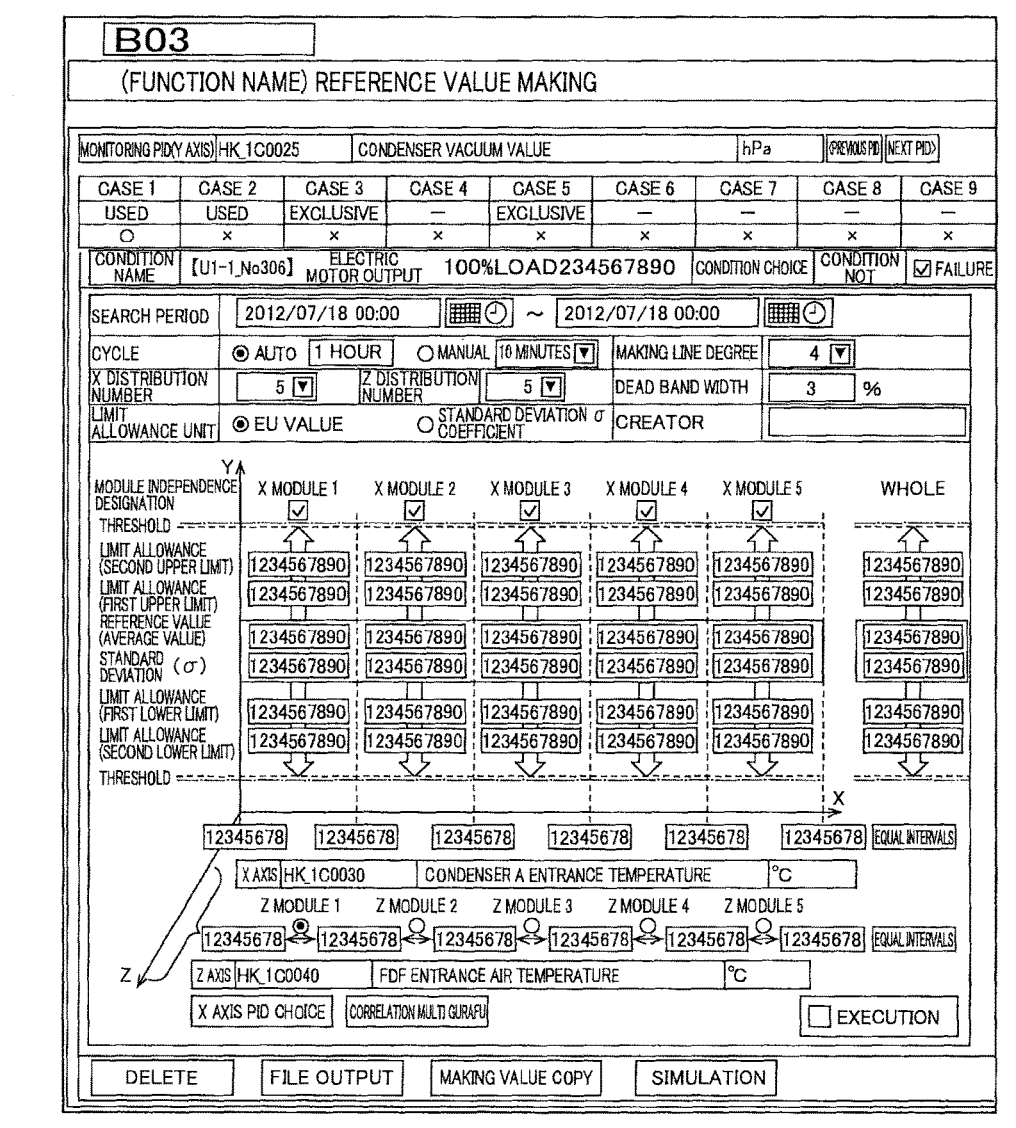

An example of a dialog screen is shown in FIG. 16 to FIG. 18. The setting module 6 inputs items, out of the monitoring condition information held by the monitoring condition storing module 5, which are set by an operator with the dialog screen, from user interface devices such as a CRT, K/B, and mouse via the dialog screen. FIG. 16 is a diagram showing a screen example in the case where the correlation monitoring (zone correlation monitoring) is specified as the monitoring method. FIG. 17 is a diagram showing a screen example in the case where the correlation three-dimensional monitoring is specified. FIG. 18 is a diagram showing a screen example in the case where the chronological process value monitoring, the chronological change rate monitoring, or the chronological deviation monitoring is specified. In these dialog screen examples, the items in "Setting with Dialog Screen" are set out of the items of monitoring condition information held by the monitoring condition storing module 5.

(5: Judging Process)

The monitoring module 9 judges whether a value based on an input process value of a monitoring object deviates thresholds. The second signal processing module 91 imports the monitoring condition information from the monitoring condition storing module 5. Process data on a plant is input from the plant information receiver 2 in real time. If time series data on the input process values is information on a registered PID, the time series data is imported from the plant information receiver 2 only if the time series data satisfies the extracting condition specified in the monitoring condition information.

Next, the second signal processing module 91 performs signal processing in accordance with the content of the monitoring condition information. This signal processing is the same processing method as that of the signal processing for calculating thresholds. That is, while only data satisfying the searching condition is imported, noise being abrupt changes is removed, and the data is sent to the threshold acquiring module 92. Note that the second signal processing module 91 may use the first signal processing module 72. In this case, the second signal processing module 91 and the first signal processing module 72 are defined as a signal processing module.

The threshold acquiring module 92 calculates thresholds based on information on the thresholds acquired by the statistical processing module 73. For example, when the correlation monitoring is set to the monitoring condition information in the monitoring condition storing module 5, the threshold acquiring module 92 calculates a first upper limit value, a first lower limit value, a second upper limit value, and a second lower limit value that correspond to input process values of the monitoring object. For example, a value of a correlation PIDY sent from the second signal processing module 91 is substituted into the nth degree polynomials of the first upper limit value, the first lower limit value, the second upper limit value, and the second lower limit value that are obtained by statistical processing by the statistical processing module 73. A first upper limit value, a first lower limit value, a second upper limit value, a second lower limit value at a current time corresponding to the process value a monitoring object are thereby calculated as thresholds. These thresholds are sent to the judging module 93.

The judging module 93 compares a process value that is chronologically acquired from a point of a monitoring object (monitored object PIDY) with at least one of a corresponding first threshold and second threshold to judge whether the process value exceeds one of the first threshold and the second threshold. When one of the chronological process value monitoring, the chronological change rate monitoring, and the chronological deviation monitoring is set to the monitoring condition information in the monitoring condition storing module 5, whether the process value of the monitoring object deviates one of the first threshold and the second threshold may be judged using information on the thresholds that is stored in advance in the threshold storage module 8. The judging module 93 sends the result thereof to the warning module 10.

(6: Alert Processing)

The warning module 10 creates, based on the judgment result from the judging module 93, alert information as to whether the process value of the monitoring object exceeds the thresholds in a direction deviating the thresholds (alert) or returns from the state of the deviation to a state a state of no deviation (normal). The warning module 10 also stores a previous state of the monitored object PID in question and compares the previous and current states and output alert or normal when a change occurs. In addition, for example, it may be the judging module 93 that also stores the previous state of the monitoring object PID and compares the previous and current states and output alert or normal when a change occurs.

In addition, the warning module 10 may cause the alert information to contain, based on the judgment result from the judging module 93, an occurrence time point when a state of deviation occurs and a returning time point of returning from the state of deviation to a state of no deviation. In this case, since the alert information contains the time point of the occurrence of an alert and the time point of return, it is possible to easily grasp when the state changes. In addition, all judging functions held by in the warning module 10 may be held by the judging module 93.

FIG. 19 is a diagram for illustrating items as the alert information created by the warning module 10. FIG. 20 is a diagram for illustrating alert information created by the warning module 10. Alert information is created for display items as shown in FIG. 19. The warning module 10 sends the created alert information to the recorder 11 to record it as alert information. For example, the example of the alert information is contrived to allow records to be accessed at random, by adding a record number or an occurrence time point to it.

(7: Displaying Process of Alert)

The displaying device 12 receives an alert message based on the alert information from a recorded file in the recorder (display controlling module) 11. This allows an operator to monitor the alert message to be displayed. There are two kinds displaying method examples, "trend display" and "history display" for an alert message. FIG. 21 is a diagram showing an example of an alert message (trend). FIG. 22 is a diagram showing an example of an alert message (history). This allows the operator to check an alert message that arises at any time by checking the screen illustrated in FIG. 21. In addition, the operator can check the occurrence of an alert or a returned state in a retroactive manner by checking the screen illustrated in FIG. 22.

(Advantage)

According to the present embodiment, it is possible to reduce noise by subjecting process values to the signal processing with the data processing by the first signal processing module 72. For this reason, there is an advantage of importing process values more accurately and calculating thresholds. Furthermore, when alert monitoring is performed in real time, the second signal processing module 91 also reduces the noise of real-time data. This brings an advantage of importing process values accurately to perform the alert monitoring.

In addition, it is possible to dividing correlation values into zones when the statistical processing module 73 performs statistical processing on thresholds that are to be subjected to correlation monitoring and sets thresholds independently for each zone. It is thereby possible, even for data that is unbalanced due to the operating state or the characteristics of a plant, to set thresholds suitable for the characteristics thereof. As a result, there is an advantage of performing accurate alert monitoring.

Furthermore, the statistical processing module 73 can acquire two levels of thresholds: a first upper limit value, a first lower limit value, a second upper limit value, and a second lower limit value. This allows the two levels of thresholds to be used, enabling an alert as sign detection to be output before a serious alert is detected. For this reason, there is also an advantage in sign detection.

In addition, the number of correlated points used to the judgment when the correlation monitoring is performed. This brings an advantage of accurately performing the correlation monitoring on a monitoring object that have been unable to be monitored. For example, classifying by temperature zone or pressure zone enables accurate correlation monitoring to be performed.

In addition, it is possible, for a PID (point) having no correlation with the other process value or having only a weak correlation therewith, to acquire thresholds by subjecting chronological data to statistical processing. This enables the chronological monitoring, the chronological change rate monitoring, and the chronological deviation monitoring.

For this reason, there is an advantage of accurately performing monitoring on various process values and process values having various characteristics in a plant.

According to the present embodiment, it is possible to accurately perform the threshold monitoring to issue an alert. This allows an operator to safely perform operation and handling, or a monitoring work of a plant. This result allows the operator to sufficiently contribute to safety operation of a plant and the detection of an anomaly in its early stages.

(Second Embodiment)
(Configuration)

Figure 23:
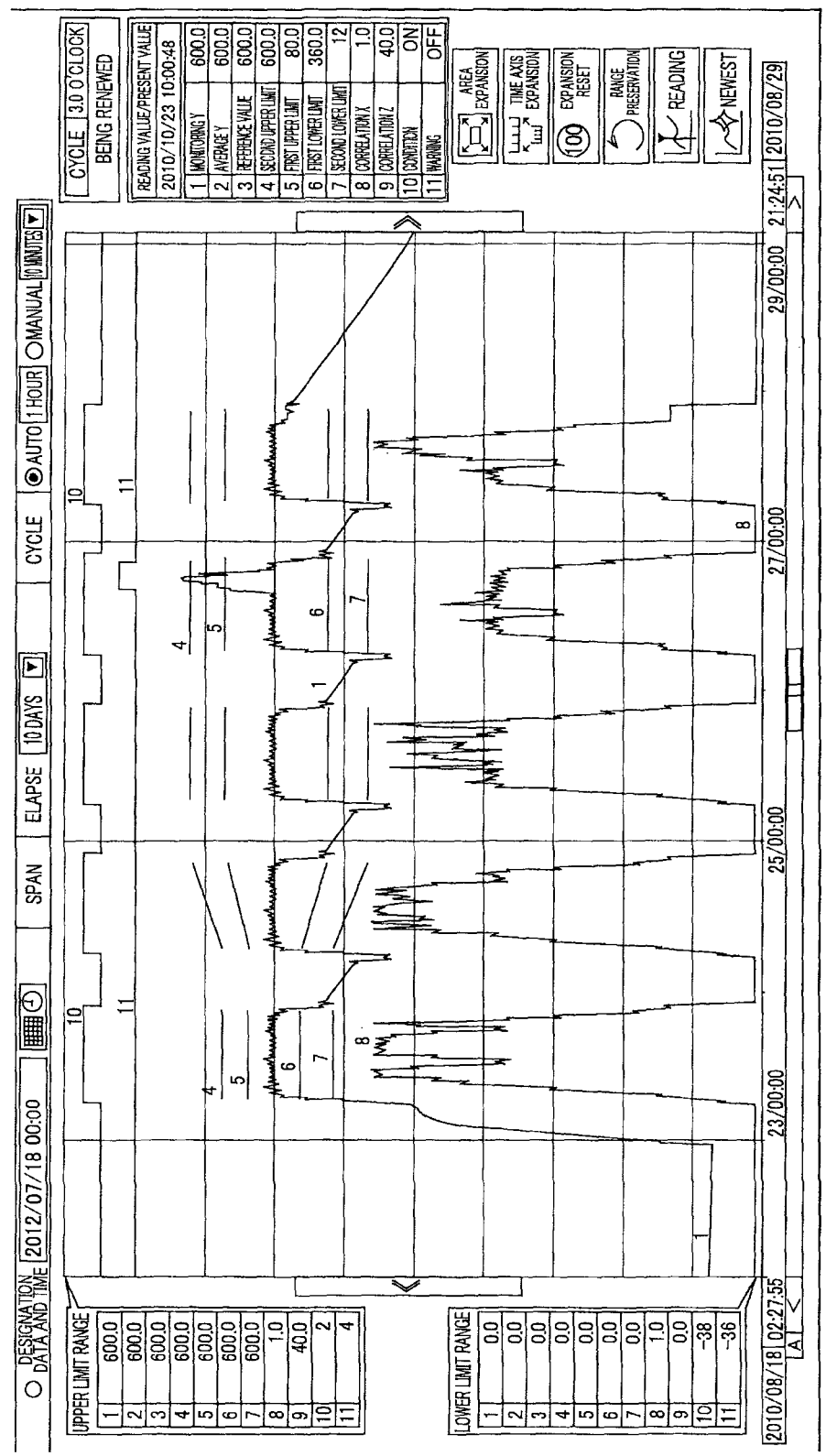
FIG. 23 is a diagram for illustrating a screen that is displayed in accordance with an alert message specified by an operator.
Figure 24:
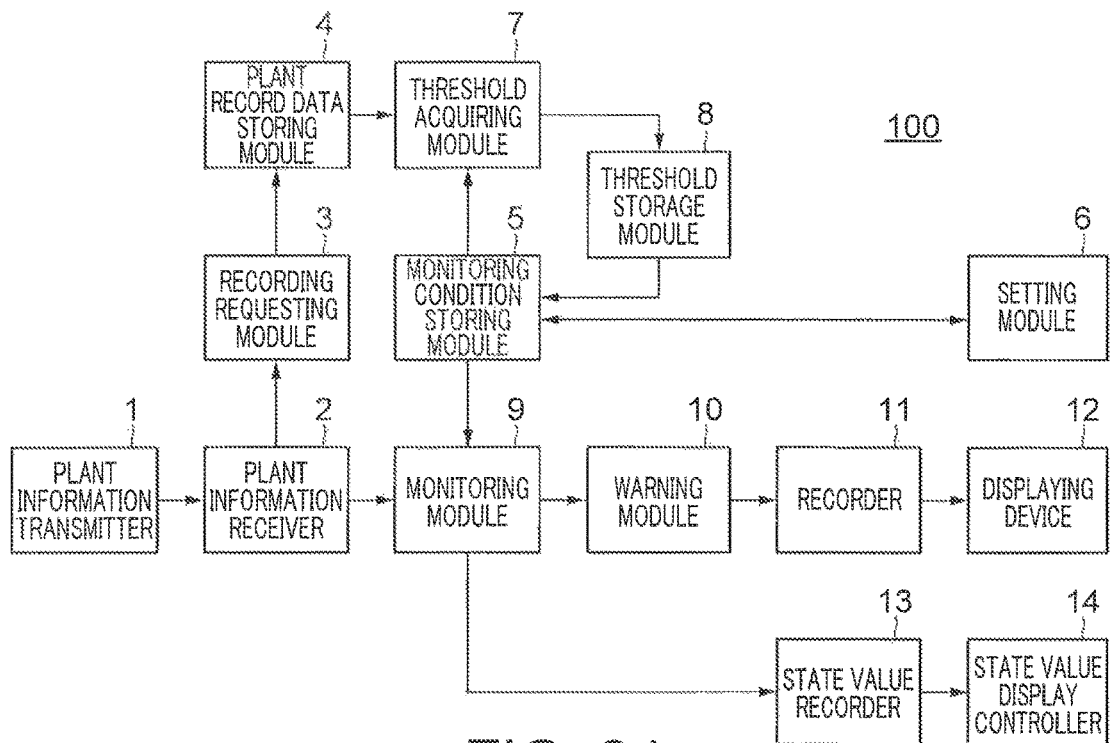
FIG. 24 is a block diagram showing a configuration example of a plant monitoring system 100 in a second embodiment.

FIG. 23 is a diagram for illustrating a screen that is displayed in accordance with an alert message specified by an operator. FIG. 24 is a block diagram showing a configuration example of a plant monitoring system 100 in a second embodiment. The difference is in that, in addition to the plant monitoring system 100 in the first embodiment, a state value recorder 13 and a state value display controller 14 are included. Components similar to those of the plant monitoring system 100 in the first embodiment are denoted by the same reference numeral and will not be described.

With reference to FIG. 24, the configuration of the plant monitoring system 100 in the second embodiment will be described.

The monitoring module 9 inputs a result signal representing judgment as to whether a data extracting condition output from the second signal processing module 91 is satisfied and a signal obtained by applying a filter to remove noise, into the state value recorder 13. In addition, the monitoring module 9 inputs a result signal representing the acquisition (calculation) of thresholds by the threshold acquiring module 92, into the state value recorder 13.

The state value recorder 13 records these pieces of monitoring information that arises at every moment in real time, as state values. The recorded data is sent to the state value display controller 14 to cause the displaying device 12 and the like to display the recorded data as monitoring state values.

(Action)

The second signal processing module 91 imports real-time process data on a plant sent from the plant information receiver 2 only if the process data satisfies an extracting condition specified in the monitoring condition information in the monitoring condition storing module 5.

If the process data satisfies the extracting condition, the second signal processing module 91 treats the value thereof as a state value as it is, or otherwise creates a state value determining that the process data is not an alert monitoring object but a deficient data. Furthermore, the second signal processing module 91 performs, on the state value, one of the processes: the averaging process, the moving average process, the conditioned moving average process, the filtering process, which is a monitoring method set to the monitoring condition information in the monitoring condition storing module 5. A signal subjected to the process is sent to the threshold acquiring module 92 as well as to the state value recorder 13.

For example, in the case of the correlation monitoring, the threshold acquiring module 92 calculates thresholds using a polynomial based on the threshold information that is calculated by the statistical processing module 73. In such a manner, an actual threshold at each time calculated using real-time process data on a plant sent from the plant information receiver 2. The thresholds being this calculation result are sent to the state value recorder 13.

The judging module 93 also sends the result of similar alert processing to the state value recorder 13 not in the form of a message but a state value representing an alerting state. For example, the judging module 93 outputs, to the state value recorder 13, a state value corresponding to a first upper limit value and a first lower limit value as the first thresholds or a second upper limit value and a second lower limit value as the second thresholds that the first process value of a monitoring object exceeds.

The state value recorder 13 records a real-time signal processing result from the threshold acquiring module 92 or a real-time threshold from the judging module 93, and an alert processing result from the judging module 93. Each data item is given a PID and recorded in a predetermined recording format as in the plant record data storing module 4.

The state value displaying module (display controlling module) 14 takes out the recorded data and causes the displaying device 12 (CRT monitor) to graphically display a data processing result, an alerting state, and the like as shown in FIG. 23 to present them to an operator.

Reference numeral 1 denotes time series data that is acquired from a point (first point) of a monitoring object. Reference numerals 4 to 7 denotes time series data on a first upper limit value, a first lower limit value, a second upper limit value, and a second lower limit value. Reference numeral 8 denotes time series data that is acquired from a correlated point (second point) having a correlation with the point of the monitoring object. Reference numeral 10 denotes time series data that represents whether or not the extracting condition is satisfied. Reference numeral 11 denotes time series data on a state value that represents whether one of the thresholds is exceeded. Presenting such information allows an operator to easily grasp the state of a plant.

(Advantage)

In the prior art, instantaneous values of a monitored object PID are graphically displayed as information. In contrast to this, in the present embodiment, a value subjected to signal processing is also recorded, enabling joint display with a chronological graph.

In addition, in the prior art, whether the monitored object PID is brought into an alerting state or returns is perceived by checking whether the alert displays of FIG. 21 and FIG. 22 are in the alerting state. In contrast to this, the plant monitoring system 100 in the present embodiment can graphically display a condition result or a signal processing result processed by the second signal processing module 91, real-time thresholds calculated by the threshold acquiring module 92, and the state value of an alerting state judged by the judging module 93, together with the value of the monitored object PID, as illustrated in FIG. 23.

In addition, the state value recorder 13 can records items relating to the processes such as a monitoring condition, information on signal processing (e.g., filter), and the polynomial of a threshold. Causing the displaying device 12 or the like to display these pieces of information via the state value display controller 14 thereby allows an operator to easily understand the state of a plant. This brings an advantage of allowing monitoring to be performed smoothly. For this reason, even when processes become complicated for plant monitoring, it is possible to grasp how the calculation is performed and how the judgment is made.

In such a manner, an operator can learn how the data items have changed, recognizes the monitoring state more clearly, and can contribute to safety operation of the plant.

(Third Embodiment)

(Configuration)

Figure 25:
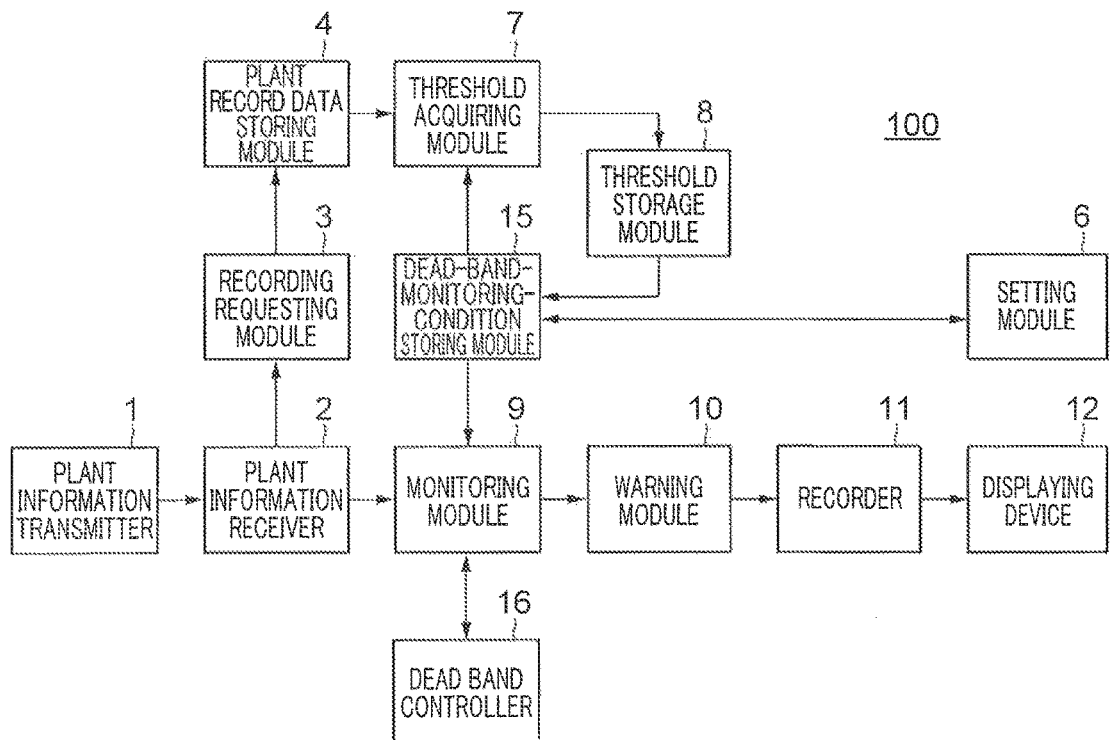
FIG. 25 is a block diagram showing a configuration example of a plant monitoring system 100 in a third embodiment.

FIG. 25 is a block diagram showing a configuration example of a plant monitoring system 100 in a third embodiment. The difference is in that, instead of or in addition to the configurations of the plant monitoring systems 100 in the first embodiment and the second embodiment, a dead-band-monitoring-condition storing module 15 and a dead band controller 16 are included. Components similar to those of the plant monitoring system 100 in the first embodiment are denoted with the same reference numerals and will not be described. The plant monitoring system 100 in the third embodiment is for performing accurate monitoring without sensitively capturing minute fluctuations in the process values of a monitoring item.

With reference to FIG. 25, the configuration of the plant monitoring system 100 in the third embodiment will be described. The dead-band-monitoring-condition storing module 15 stores information on a dead band. The dead-band-monitoring-condition storing module 15 outputs information on the dead band to the threshold acquiring module 7 and the monitoring module 9. Furthermore, when the monitoring module 9 performs deviation judgment of thresholds, the dead band controller 16 receives the alert information thereon from the judging module 93, performs dead band judgment, and sends the result thereof to the judging module 93 as a response.

In this regard, the judging module 93 has a predetermined width for a first upper limit value, a first lower limit value, a second upper limit value, and a second lower limit value corresponding to the process value of a monitoring object as a dead band. To judge whether a process value deviates, whether one of the values of the first upper value, the first lower limit value, the second upper limit value, and the second lower limit value is exceeded is judged, and to judge whether the state of deviation is returned to the state of no deviation, whether the dead band is exceeded is judged.

(Action)

Figure 26:
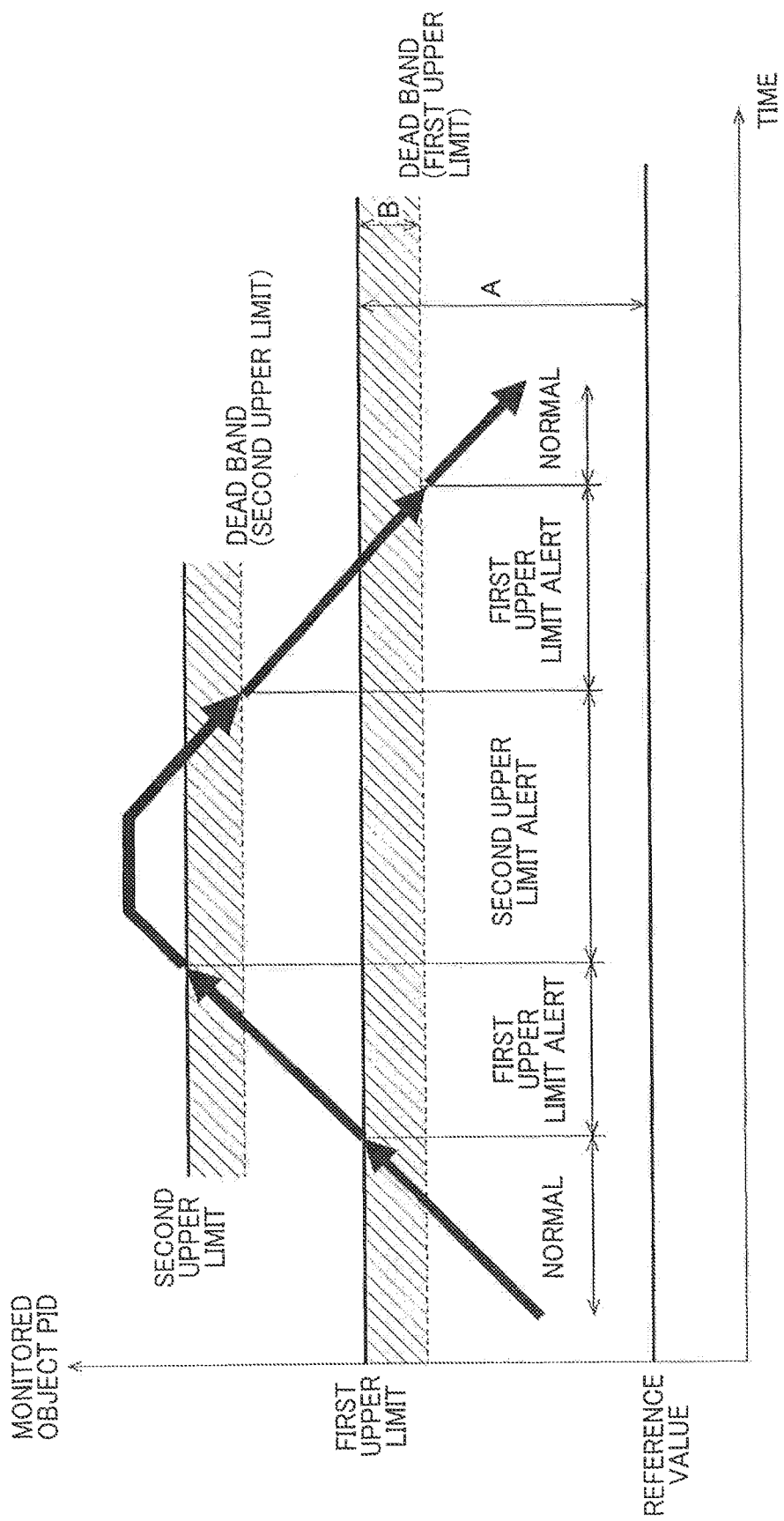
FIG. 26 is a diagram for illustrating dead bands.

FIG. 26 is a diagram for illustrating the dead band.

The dead-band-monitoring-condition storing module 15 has the definition of a dead band width on information on a monitoring condition, as shown in FIG. 26, and the dead band width is stored in percent. FIG. 26 shows the concept of the dead band width. Showing the case of the first upper limit value by way of example, a value obtained by multiplying the width between a reference value to the upper limit value by the width of a defined dead band (%) is provided on the lower side of the upper limit value, as a dead band width. Similarly, for the second upper limit value, a value obtained by multiplying the width between the reference value and the second upper limit value by the width of the defined dead band (%) is provided on the lower side of the second upper limit value, as the dead band width.

As with the first embodiment, the monitoring module 9 monitors process data on a plant that is transmitted in real time. When the judging module 93 performs threshold judgment, the dead band controller 16 receives the information thereon and performs a dead band process. As illustrated in FIG. 26, the state that time elapses from the left side to the right side and a process value changes as shown by arrows, is shown. At first, the process value is a value smaller than the first upper limit being one of thresholds, which means a normal state. Next, the process value increases to exceed the first upper limit value, which causes a first upper limit alert. The process value further increases to exceed a second upper limit, which causes a second upper limit alert.

Thereafter, even if the process value decreases to become below the second upper limit, the second upper limit alert is not canceled. In contrast, when the process value becomes below the second upper limit plus the dead band width, the second upper limit alert is canceled. When the process value further decreases to become below the first upper limit and becomes below by the dead band width, the first upper limit alert is canceled and the normal state is brought. The description is made using the upper limit side, and the same is true for the lower limit side. The dead band controller 16 is a module for detecting this dead band to perform alert monitoring.

(Advantage)

In the case where the dead band controller 16 is absent, when a process value repeats a minute variation in the vicinity of a threshold, a monitored object PID repeats "alert occurred," and "normal return." Thus, the alert display screens of FIG. 21 and FIG. 22 are covered with "alert occurred" and "normal return," and there is a risk that the other important information on the monitored object PID is obscured.

In contrast to this, by providing dead bands with the dead band controller 16, it is possible to prevent the alerting state and the normal state from being repeated even when a process value of a plant repeats a minute variation in the vicinity of one of a first upper limit value, a first lower limit value, a second upper limit value, a second lower limit value, being the thresholds calculated through statistical processing.

Moreover, the dead bands are set on the lower sides for the first upper limit value and the second upper limit value, and on the upper sides for the first lower limit value and the second lower limit. This brings an advantage of preventing an important alert for an operator being not displayed due to characteristics of continuing an alert and of having no influence on safety monitoring in plant monitoring.

(Fourth Embodiment)
(Configuration)

Figure 27:
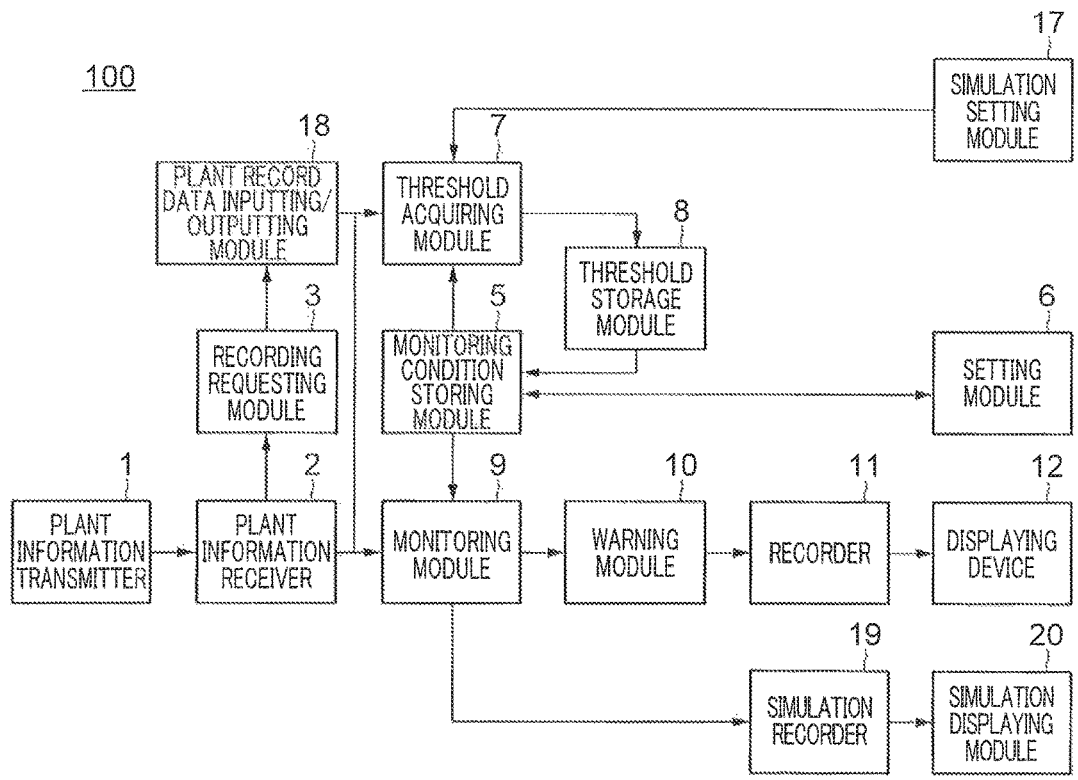
FIG. 27 is a block diagram showing a configuration example of a plant monitoring system 100 in a fourth embodiment.

FIG. 27 is a block diagram showing a configuration example of a plant monitoring system 100 in a fourth embodiment. The difference is in that, instead of or in addition to the configurations of the plant monitoring systems 100 in the first to third embodiments, a simulation setting module 17, a plant record data inputting/outputting module 18, a simulation recorder 19, and a simulation displaying module 20 are included. Components similar to those of the plant monitoring system 100 in the first embodiment are denoted with the same reference numerals and will not be described. The plant monitoring system 100 in the fourth embodiment is such that enables simulations to check whether thresholds calculated through statistical processing are effective.

With reference to FIG. 27, the configuration of the plant monitoring system 100 in the fourth embodiment will be described. An operator sets information for running a simulation to the simulation setting module 17 (first setting module). For example, the simulation setting module 17 is set a past time period necessary for the simulation.

The plant record data inputting/outputting module 18 (first storage module) stores at least process values of a monitoring object acquired from a plant. The judging module 93 of the monitoring module 9 judges whether the process values of the monitoring object during the past time period set in the simulation setting module 17 deviate from thresholds corresponding thereto. The simulation recorder 19 records a judgment result from the judging module 93 as a simulation result.

For example, the simulation recorder 19 receives and records result data on threshold monitoring that is created by the warning module 10 based on a result from the judging module 93. The simulation displaying module 20 displays an alert message based on alert information that is created by the warning module 10 based on the result from the judging module 93 to an operator via the displaying device 12 (CRT) or the like to show the result.

(Action)

Figure 28:
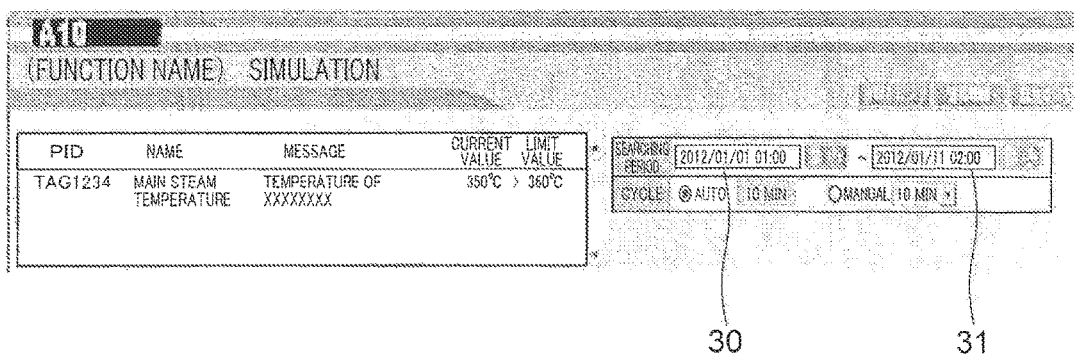
FIG. 28 is a diagram for illustrating a screen for specifying a period to run a simulation.

FIG. 28 is a diagram for illustrating a screen for specifying a period to run a simulation. The simulation setting module 17 is such that receives the specification of a period to run a simulation from an operator with a dialog screen as shown in FIG. 28. That is, a start date and time of running (30), an end date and time (31), and a simulating cycle of a simulation are specified. The simulation setting module 17 sends this information to the plant record data inputting/outputting module 18.

The plant record data inputting/outputting module 18 records, as with the plant record data storing module 4 in the first embodiment, plant process data in accordance with recording request information from the recording requesting module 3. In addition, the plant record data inputting/outputting module 18 extracts data from the plant process data that has already been recorded in accordance with the start date and time of running, the end date and time, and the cycle, being information in the plant record data inputting/outputting module 18, and sends the data to the monitoring module 9.

The monitoring module 9 performs, as with the first embodiment, alert monitoring on plant process data that is sent in real time, and also performs alert monitoring on plant data on the simulation sent from the plant record data inputting/outputting module 18. That is, the monitoring module 9 performs monitoring of normal or deviation from thresholds subjected to the statistical processing using the recorded plant process data with the period and cycle specified with the simulation setting module 17 and performs judgement. The result thereof is sent to the simulation recorder 19 via the warning module 10.

The simulation recorder 19 records, as with the recorder 11 that performs real-time recording, the alerting state with respect to the recorded plant process data with the specified simulating period/cycle. The simulation recorder 19 sends the result thereof to the simulation displaying module 20 and displays an alert message based on alert information in a lower portion of the screen that is set with the simulation setting module 17, as illustrated in FIG. 27.

(Advantage)

In conventional systems, monitoring of thresholds calculated through statistical processing is performed using plant process data send in real time. In this case, it is necessary to wait a result of alert processing performed in real time. However, the thresholds are calculated through statistical processing to detect a precursor or a sign of an anomaly in a plant, and it is thus often the case that the state of the plant is not immediately brought into such a state.

For this reason, in some cases, it is difficult to check or investigate whether the thresholds are effective or whether an alert is issued in an intended state of the plant. This makes an operator to continue for a while an operation in which alert processing is performed with thresholds uncertain about their effectiveness and to check, when an intended state of the plant is brought about, whether the thresholds correctively function to issue an alert. In such a manner, a heavy load may be imposed on an operator.

In the plant monitoring system 100 in the present embodiment, it is possible to investigate thresholds calculated through statistical processing in a short time as compared with the case of without simulation. For example, it is possible to check the occurrence state of a threshold alert using data on a past plant operational state. For this reason, it is possible to check, in a short time, whether the thresholds are effective or whether a sign or an anomaly is reliably detected, as compared with the case of without simulation. If an anomaly cannot be detected, it is possible to check the degree of alert detection of the thresholds by revising the width of the thresholds and running the simulation again.

In addition, in the case where there is an accident or a fault in past plant operations, the period of the accident or fault can be specified with a simulating period. It is thereby possible to check whether a sign or an anomaly can be detected with threshold monitoring before an accident or fault. For this reason, the plant monitoring system 100 in the present embodiment can contribute to preventing an accident or a fault.

With the present embodiment, it is understood that threshold monitoring is accurately performed and an alert is detected, which allows an operator to concentrate attention on the operation and handling, or the monitoring work of a plant with no worries and to sufficiently contribute to safety operation of a plant and the detection of an anomaly in its early stages.

(Fifth Embodiment)
(Configuration)

Figure 29:
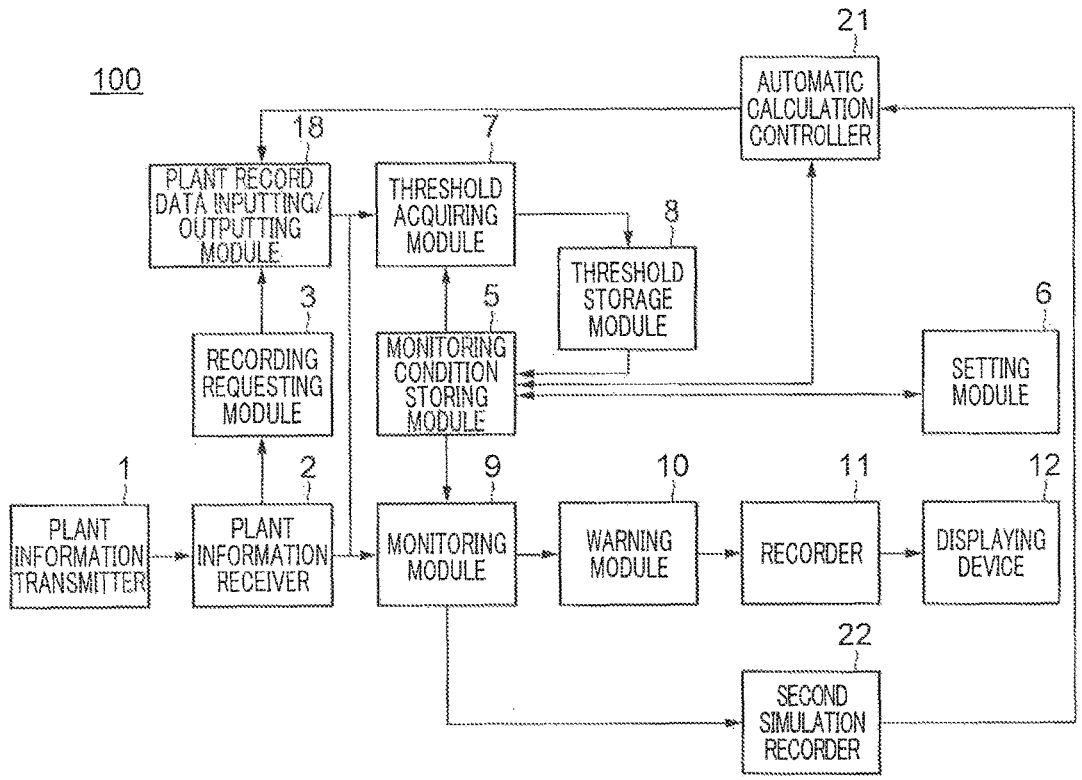
FIG. 29 is a block diagram showing a configuration example a plant monitoring system 100 in a fifth embodiment.

FIG. 29 is a block diagram showing a configuration example a plant monitoring system 100 in a fifth embodiment. The difference is in that, instead of or in addition to the configurations of the plant monitoring systems 100 in the first to fourth embodiments, an automatic calculation controller 21 and a second simulation recorder 22 are included. Components similar to those of the plant monitoring system 100 in the first embodiment will be denoted with the same reference numerals and will not be described. The plant monitoring systems 100 in the fifth embodiment is such that enables simulations to obtain thresholds suitable to detect signs of an accident or a fault in a plant.

The second simulation recorder 22 outputs a recording result to the automatic calculation controller 21, which is a difference from the simulation recorder 19. Upon receiving the output from the second simulation recorder 22, the automatic calculation controller 21 automatically changes settings used for a simulation in accordance with the input from the plant record data inputting/outputting module 18.

(Action)

Figure 30:
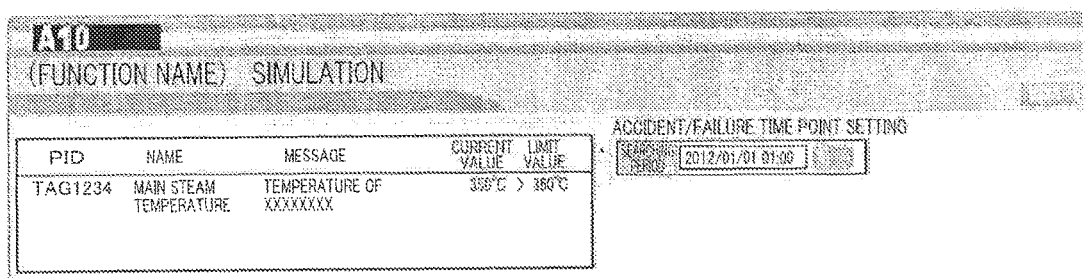
FIG. 30 is a diagram for illustrating a screen to input an operation accident/failure occurrence data/time in a plant.
Figure 31:
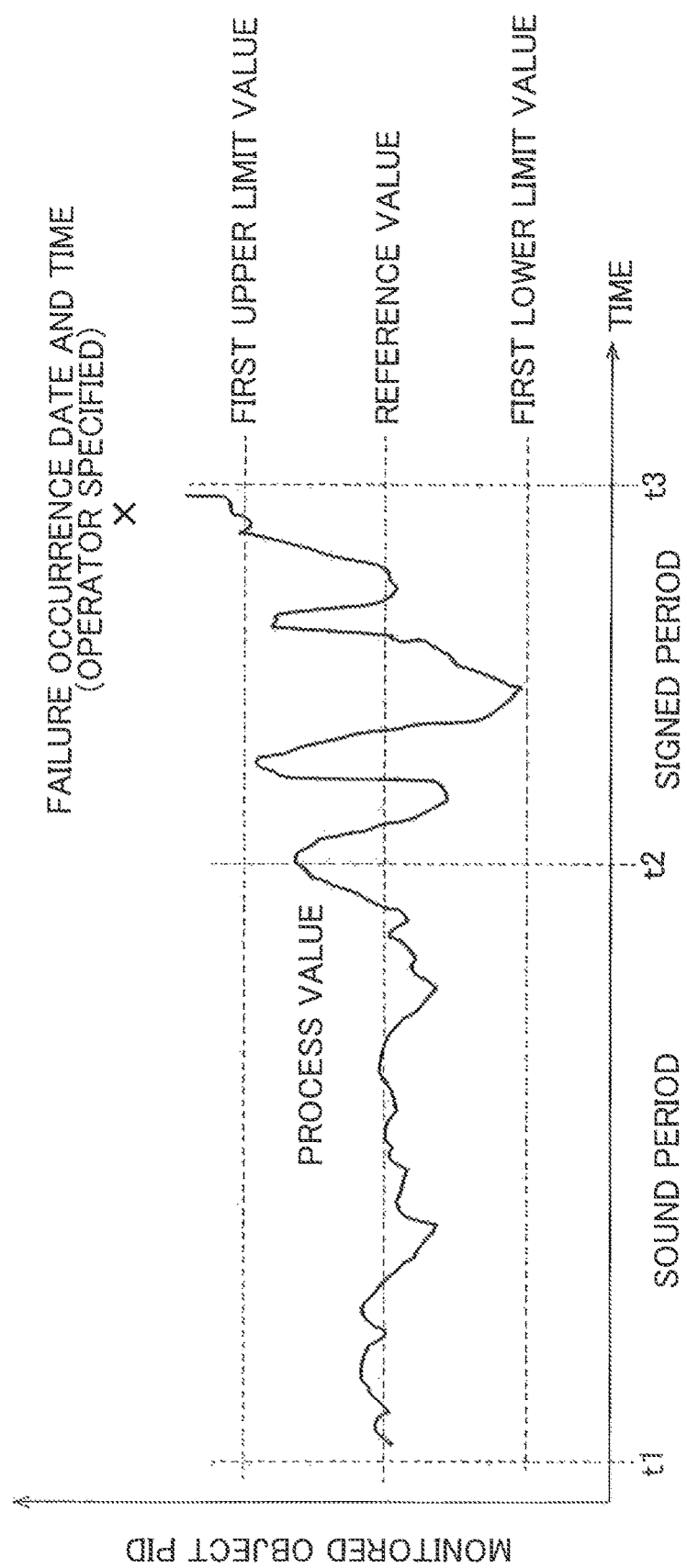
FIG. 31 is a diagram for illustrating changes in a process value.

FIG. 30 is a diagram for illustrating a screen to input an operation accident/failure occurrence data/time in a plant. The automatic calculation controller 21 is, as shown in FIG. 30, such that receives a past operation accident/failure occurrence data/time in a plant from an operator. FIG. 31 is a diagram for illustrating changes in a process value.

As illustrated in FIG. 31, in some cases, when an accident occurs, a certain process value increases or decreases to be brought into a singular state. A time period before a sign appears is referred to as a sound period (T1 and T2), and a time period thereafter until an accident occurs is referred to as a signed period (T2 and T3). In this case, if statistical processing is performed on process values during the sound period (T1 and T2) to create thresholds (an upper limit value and a lower limit value) and monitoring is performed, there is no alert occurring during the sound period (T1 and T2).

In addition, during the signed period (T2 and T3), the deviation of the thresholds is often made, and thus an alert is issued. Note that a monitored object PID is specified by an operator and the specified PID may have no correlation with an accident. In this case, the process value thereof does not change in such a manner, the PID can be treated as a PID that is not to be monitored for a sign.

With the automatic calculation controller 21, as shown in FIG. 30, an operator specifies a past operation accident/failure occurrence data/time in a plant. This time point is T3 in FIG. 31. FIG. 32 is a diagram for illustrating setting information used by the automatic calculation controller 21. The items shown in FIG. 32 are input as setting information for sign detection.

The automatic calculation controller 21 specified a data extraction starting date and time (T1) and an extraction ending date and time (T2) to the plant record data inputting/outputting module 18, in order to evaluate thresholds during the sound period. T2 is a time point that goes back by an initial value ("2-7-1" in FIG. 32 from T3 being a time point of failure specified by the operator. Furthermore, T1 is a time point that goes back from T2 by a time period obtained by multiplying a time period (T3−T2) by a specified multiple ("2-7-3" in FIG. 32). The automatic calculation controller 21 sends the dates and times T1 and T2 calculated in such a manner to the plant record data inputting/outputting module 18.

The plant record data inputting/outputting module 18 extracts plant record data during the specified period and sends the plant record data to the threshold acquiring module 7 and the monitoring module 9. The threshold acquiring module 7 performs statistical processing on this extracted plant record data to calculate thresholds, and inputs the thresholds into the monitoring condition storing module 5, via the threshold storage module 8 and sets temporal thresholds. In order to evaluate the thresholds and an threshold alert with respect to the plant record data during the sound period sent from the plant record data inputting/outputting module 18, the monitoring module 9 sends the number of alert occurrences to the automatic calculation controller 21. Note that the resultant number of alert occurrences is small because of the thresholds calculated from plant record data during the sound period.

The automatic calculation controller 21 sets the number of alert occurrences to the setting information ("2-7-4" in FIG. 32). Then, the automatic calculation controller 21 sends the dates and times T2 and T3 being the signed periods to the plant record data inputting/outputting module 18 to extract plant record data. Then, the result thereof is subjected to alert evaluation by the monitoring module 9, and the number of alert occurrences is sent to the automatic calculation controller 21. The automatic calculation controller 21 sets the number of alert occurrences to the setting information ("2-7-5" in FIG. 32).

If, with the thresholds calculated through statistical processing from the data during the sound period, the number of alert occurrences during the sound period ("2-7-4" in FIG. 32) is small and the number of alert occurrences during the signed period ("2-7-5" in FIG. 32) is large, these thresholds are suitable as thresholds with which a sign of an accident can be detected.

The time period T2 is increased by an increment shown in "2-7-2" in FIG. 32 and the above operation is performed. These are repeated until the signed periods (T2 and T3) reaches a time period shown in "2-7-3" at the maximum. It is thereby possible to treat thresholds when the alert occurrence rate between "sound period" and "signed period" reaches its maximum as thresholds with which a sign of an accident can be detected.

In such a manner, there are first to third step: the first step of, under the control of the automatic calculation controller 21, setting a first period (T3−T2) from a time point of the occurrence of an accident down to a time point before the accident occurs and a second period (T2−T1) prior to the first period; the second step in which the threshold acquiring module 7 performs statistical processing using process values of a monitoring object during the second period; and the third step of storing a ratio in the second simulation recorder 22, the ratio obtained by dividing the number of times the judging module 93 judges that the deviation occurs during the first period by the number of times the judging module 93 judges that the deviation occurs during the second period.

Then, under the control of the automatic calculation controller 21, the first to third steps are repeated while the lengths of the first period and the second period are changed. Then, under the control of the automatic calculation controller 21, the thresholds acquired by the threshold acquiring module 7 using process values of a monitoring object during the second period with which the ratio reaches its maximum are set. As described above, it is possible to calculate thresholds for detecting a sign using data at the time of a past accident occurrence.

Note that although the number of alert occurrences is treated as a performance index for the sign detection in the present embodiment, the judgment may be made using an index such as a correlation index between plant record data items during the sound period and the signed period, and the degree of distribution of data.

(Advantage)

Some operation accidents in a plant involve a sign, and others involve no sign (there is no sign for such an accident that occurs because an operator operating a plant makes a mistake in pushing a button). For an accident that involves a sign, it is possible to easily calculate thresholds for monitoring as in the present embodiment.

It is thereby possible, if there is an accident or a fault in a past plant operations, to detect a sign of an accident or a fault with the threshold monitoring before the accident or the fault occurs, by specifying the occurrence date and time thereof. Conducting the present embodiment allows the prevention of occurrence of an accident or the prevention of recurrence of an accident, which contributes to safety operation of a plant.

(Sixth Embodiment)
(Configuration)

Figure 33:
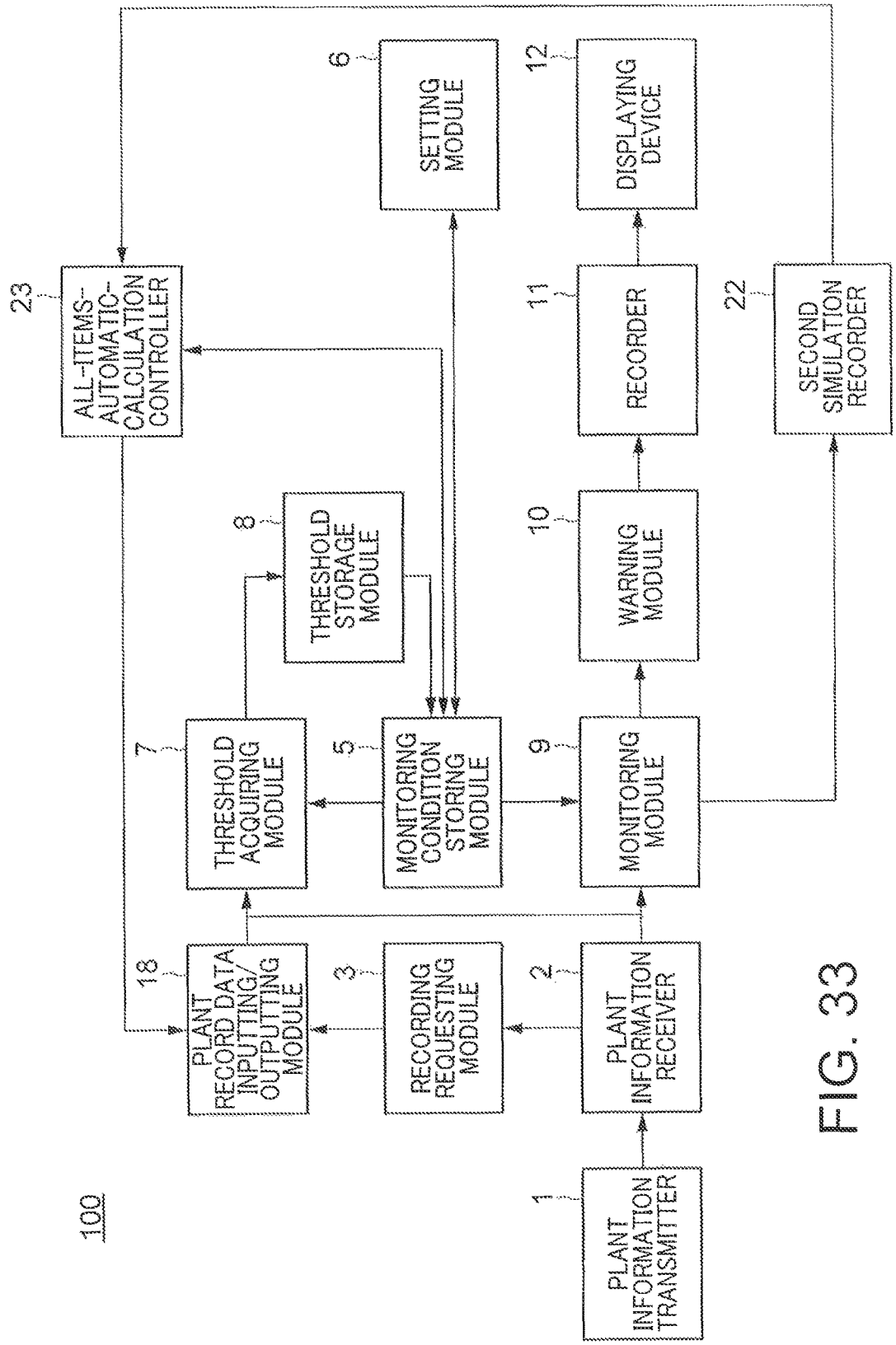
FIG. 33 is a block diagram showing a configuration example of a plant monitoring system 100 in a sixth embodiment.

FIG. 33 is a block diagram showing a configuration example of a plant monitoring system 100 in a sixth embodiment. The difference is in that, instead of or in addition to the configurations of the plant monitoring systems 100 in the first to fifth embodiments, an all-items-automatic-calculation controller 23 and a second simulation recorder 22 are included. Components similar to those of the plant monitoring system 100 in the first embodiment are denoted with the same reference numeral and will not be described.

The plant monitoring system 100 in the sixth embodiment is such that enables the periodical evaluation of thresholds of a registered monitored object PID. The all-items-automatic-calculation controller 23 periodically evaluates the thresholds.

The all-items-automatic-calculation controller 23 sets a third period that is a time range earlier by a predetermined period than a time point to start the simulation, and adjusts the thresholds corresponding to each of the process values of all monitoring objects based on a judgment result from the judging module 93 for each of the process values of all the monitoring objects during the third period.

(Action)

The all-items-automatic-calculation controller 23 periodically sends, in accordance with monitoring condition information in the monitoring condition storing module 5 on a registered monitored object PID, a time period that goes back from the current time by a specified time period to the plant record data inputting/outputting module 18, as an extracting period (third period). Plant record data extracted by the plant record data inputting/outputting module 18 is sent to the monitoring module 9 and subjected to alert evaluation together with thresholds that have already been subjected to statistical processing, and the result thereof is sent to the second simulation recorder 22. The second simulation recorder 22 sends the number of alert occurrences to the all-items-automatic-calculation controller 23. The all-items-automatic-calculation controller 23 is such that adjusts the lower limits of the thresholds by considering the degree of margin of the thresholds from the number of alert occurrences.

(Advantage)

In some cases, thresholds shift after thresholds are subjected to statistical processing, due changes in the operating status of a plant, an external cause, or the like. The present embodiment brings an advantage of adjusting thresholds for an item the thresholds of which shift with the lapse of time and always providing thresholds suitable for monitoring to an operator.

(Seventh Embodiment)
(Configuration)

Figure 34:
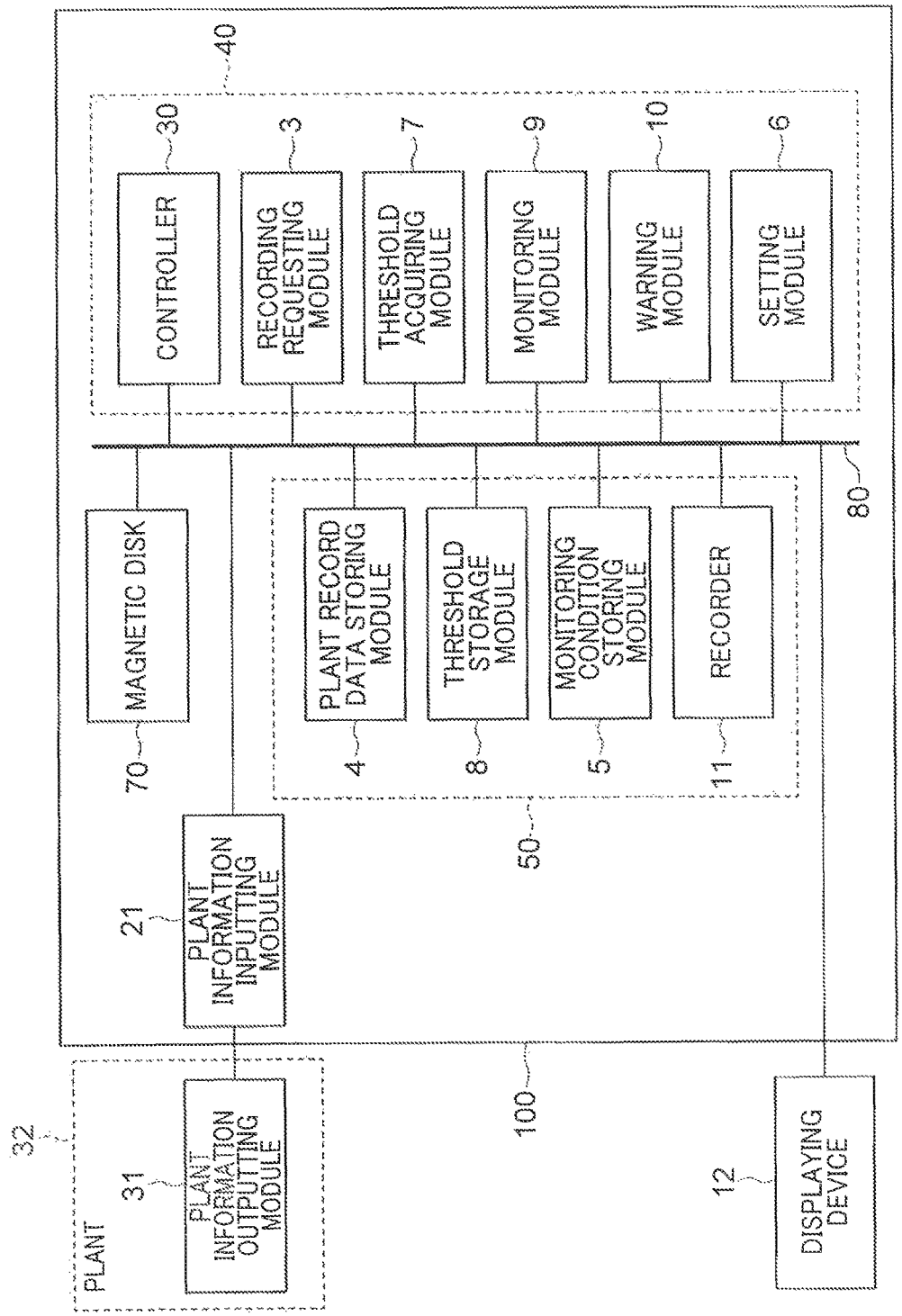
FIG. 34 is a block diagram showing a configuration example of a system including a plant monitoring system 100 in a seventh embodiment.

FIG. 34 is a block diagram showing a configuration example of a system including a plant monitoring system 100 in a seventh embodiment.

The plant monitoring system 100 in the present embodiment is, for example, a computer such as a server, a personal computer, or the like that is installed in a monitoring room in a plant 32. The difference from the first to sixth embodiments is in that a controller 30 (a CPU or MPU) is included, the controller 30 controlling the action of a component 40 and a storage module 50 in the plant monitoring system 100 by the execution of a program.

In the present embodiment, the configuration and the action will be described using the configuration in the first embodiment. However, the plant monitoring systems 100 in the first to sixth embodiments can also perform control through the execution of a program by the controller 30.

The storage module 50 stores a control program to be executed by the controller 30 and provides a working area for the execution of the program by the controller 30. In addition, the storage module 50 forms a storage module such as the plant record data storing module 4, the monitoring condition storing module 5, the threshold storage module 8 and the recorder 11.

The magnetic disk 70 stores an operating system (OS), a device driver of peripheral equipment, various application software including a program to perform a plant monitoring process, which will be described below, and the like. The displaying device 12 is, for example, a CRT monitor or a liquid crystal display monitor, and displays images based on data from the storage module 50. The above components are connected to one another by a common bus 80 so as to communicate with one another. Data that is chronologically acquired from a point (PID) in a plant from the plant 32 such as a power plant via the plant information outputting module 31 is input into the plant monitoring system 100 via the plant information inputting module 21. The controller 30 processes the data input into the plant monitoring system 100, under a control program.

A computer-readable storage medium in which programs that implement the functions of the above-mentioned first to sixth embodiments are stored is provided to a system or a device. It should be appreciated that the object of the present invention is achieved also by a computer (or a CPU or MPU) in the system or device reading and executing a program code stored in the storage medium.

In this case, the program code itself read from the storage medium is to implement the functions of the above-mentioned embodiments, and the storage medium storing the program code is to configure the present invention.

As a storage medium to provide the program code, for example, a floppy disk, hard disk, optical disk, magneto-optical disk, CD-ROM, CD-R, magnetic tape, nonvolatile memory card, ROM, or the like can be used.

(Action)

Figure 35:
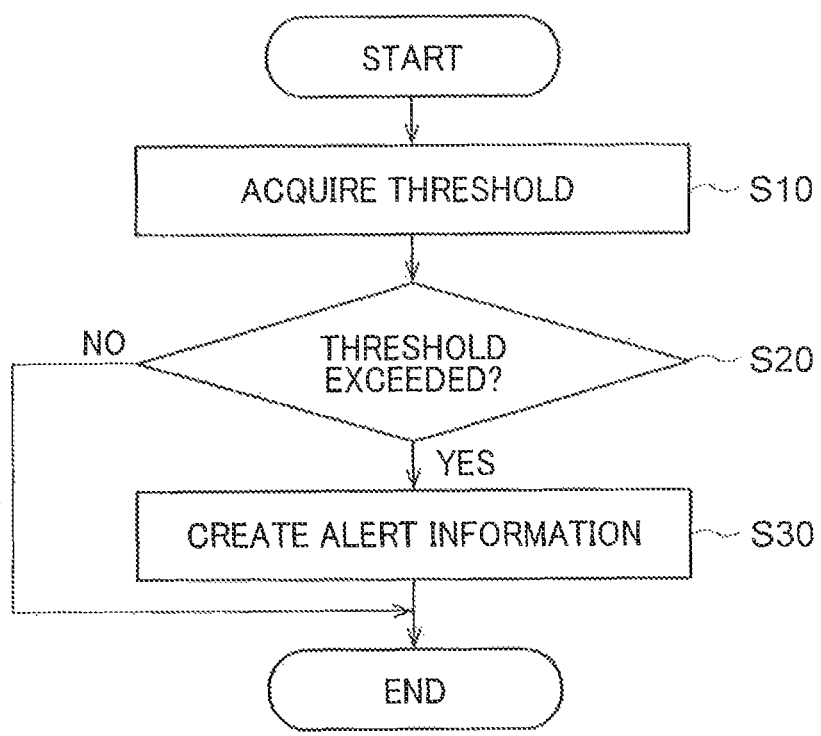
FIG. 35 is a flow chart showing an example of a plant monitoring process of the plant monitoring system 100.

FIG. 35 is a flow chart showing an example of a plant monitoring process of the plant monitoring system 100. Next, referring to the flow chart in FIG. 35, an example of the plant monitoring process of the plant monitoring system 100 will be illustrated.

The threshold acquiring module 7 acquires in advance, based on a value obtained by leveling the dispersion in first process values that are acquired in advance from a first point in a monitoring object in a plant 10 and a value representing the dispersion, first thresholds that represent a first range of the dispersion in the first process values, and second thresholds that represent a second range, which is a range wider than the first range in dispersion (S10).

The judging module 93 in the monitoring module 9 compares the first process values chronologically acquired from the first point in the monitoring object with a corresponding first threshold and second threshold to judge whether the first process value exceeds one of the first threshold and the second threshold (S20-Yes) or not (S20-No) (S20).

The warning module 10 creates, based on the judgment result from the judging module 93, alert information that contains information on a time point when the first process value exceeds one of the first threshold and the second threshold (S30).

In such a manner, as shown in FIG. 35, thresholds are acquired based on first process values that are acquired in advance. Then, alert information is created based on the result of comparison between the thresholds and the first process value of a monitoring object. In such a manner, the controller 30 repeats the processes S10 to S30 to process values input from a point in the monitoring object, under the control program.

(Advantage)

Executing the program code read by the computer not only implements the functions of the above-mentioned embodiments, but also causes an OS (operating system) and the like running on the computer to perform a part or the whole of actual process based on instructions from the program code. Then, the process implements the functions of the above-mentioned embodiments.

At least a part of the data processing method in the plant monitoring system 100 according to the above embodiments may be formed of hardware or software. In the case of software, a program realizing at least a partial function of the data processing method may be stored in a recording medium such as a flexible disc, CD-ROM etc. to be read and executed by a computer. The recording medium is not limited to a removable medium such as a magnetic disk, optical disk, etc., and may be a fixed-type recording medium such as a hard disk device, memory, etc. Further, a program realizing at least a partial function of the data processing method can be distributed through a communication line (including radio communication) such as the Internet. Furthermore, this program may be encrypted, modulated, and compressed to be distributed through a wired line or a radio link such as the Internet or through a recording medium storing it therein.

While certain embodiments have been described, these embodiments have been presented by way of example only, and are not intended to limit the scope of the inventions. Indeed, the novel systems, methods and media described herein may be embodied in a variety of other forms; furthermore, various omissions, substitutions and changes in the form of the systems, methods and media described herein may be made without departing from the spirit of the inventions. The accompanying claims and their equivalents are intended to cover such forms or modifications as would fall within the scope and spirit of the inventions.

The invention claimed is:

1. A computerized system for plant monitoring comprising:
   a processor; and
   a storage medium storing instructions that, when executed, configure the processor to execute:
      a threshold acquiring module configured to calculate first thresholds and second thresholds, the first thresholds and the second thresholds being based on an average value and a value representing a dispersion in the first process values, the average value being obtained by averaging the first process values acquired in advance from a first measuring point, the first measuring point being arranged in a monitoring object,
         wherein the first thresholds represent a first range of the dispersion and the second thresholds represent a second range of the dispersion wider than the first range;
      a judging module configured to judge whether one of the first process values exceeds one of the first thresholds and the second thresholds, the first process values being chronologically acquired from the first measuring point; and
      a warning module configured to create, based on a judgment result from the judging module, alert information specifying which of the first thresholds and the second thresholds are exceeded by the first process value.

2. The system of claim 1, wherein the threshold acquiring module is further configured to:
   calculate:
      a reference value based on an average value of the first process values that correspond to second process values acquired from a second measuring point different from the first measuring point; and
      a standard deviation of the first process values based on the reference value;
   set a first upper limit value and a first lower limit value as the first thresholds, the first upper limit value being a value obtained by adding, to the reference value, a value obtained by multiplying the standard deviation by a first upper limit coefficient, and the first lower limit value being a value obtained by adding, to the reference value, a value obtained by multiplying the standard deviation by a first lower limit coefficient; and
   set a second upper limit value and a second lower limit value as the second thresholds, the second upper limit value being a value obtained by adding, to the reference value, a value obtained by multiplying the standard deviation by a second upper limit coefficient, and the second lower limit value being a value obtained by adding, to the reference value, a value obtained by multiplying the standard deviation by a second lower limit coefficient.

3. The system of claim 2, wherein values of the second process values are divided into a plurality of ranges, and the reference value, the first thresholds, and the second thresholds are independently calculated for each range.

4. The system of claim 1, wherein the threshold acquiring module is further configured to:
   calculate, as the first process values, difference values between:
      first process values acquired from the first measuring point;
      and second process values acquired from the first measuring point, the second process values being acquired after a predetermined time period from when the first process values are acquired,
   calculate an average value of the first process values;
   calculate a standard deviation based on the average value;
   set a first upper limit value and a first lower limit value as the first thresholds, the first upper limit value being a value obtained by adding, to the average value, a value obtained by multiplying the standard deviation by a first upper limit coefficient, and the first lower limit value being a value obtained by adding, to the average value, a value obtained by multiplying the standard deviation by a first lower limit coefficient, and set a second upper limit value and a second lower limit value as the second thresholds, the second upper limit value being a value obtained by adding, to the average value, a value obtained by multiplying the standard deviation by a second upper limit coefficient, and the second lower limit value being a value obtained by adding, to the average value, a value obtained by multiplying the standard deviation by a second lower limit coefficient.

5. The system of claim 1, further comprising
a signal processing module configured to perform a process of reducing noise from process values chronologically acquired from a measuring point in a plant,
wherein process values used by the threshold acquiring module and the judging module are signals that are processed by the signal processing module.

6. The system of claim 1, wherein the judging module is configured to
output a state value corresponding to a first upper limit value or a first lower limit value as the first thresholds, or a second upper limit value or a second lower limit value as the second thresholds, which are exceeded by the first process value, and
cause a displaying device to display the output state value.

7. The system of to claim 1, wherein the judging module has predetermined widths that are defined in advance with respect to a first upper limit value, a first lower limit value, a second upper limit value, and a second lower limit value corresponding to the first process values, as dead bands, in the case of judging whether the first process values make a deviation, the judging module judges whether the first process values exceeds a value of one of the first upper limit value, the first lower limit value, the second upper limit value, and the second lower limit value, and in the case of judging whether a state of the deviation is returned to a state of no deviation, the judging module judges whether the first process values exceeds one of the dead bands.

8. The system of claim 1, further comprising:
a first storage module configured to store at least a process value of a monitoring object acquired from a plant;
a first setting module configured to set a past time period; and
a simulation recorder configured to record a judgment result from the judging module as a simulation result;
wherein
the threshold acquiring module acquires in advance, using statistical processing, thresholds corresponding to the process value of the monitoring object stored in the first storage module, and
the judging module is configured to judge whether the process value of the monitoring object during the past time period set by the first setting module deviates from one of the corresponding thresholds.

9. A non-transitory computer-readable medium storing a program that, when executed by a processor, causes the processor to perform operations to function as:
a threshold acquiring module that calculates first thresholds and second thresholds, the first thresholds and second thresholds being based on an average value and a value representing a dispersion in the first process values, the average value being obtained by averaging the first process values acquired in advance from a first measuring point, the first measuring point being arranged in a monitoring object,
wherein the first thresholds represent a first range of the dispersion and second thresholds represent a second range of the dispersion wider than the first range in dispersion;
a judging module that compares the first process values with the corresponding first thresholds and second thresholds to judge whether the first process value exceeds one of the first thresholds and the second thresholds, the first process values being chronologically acquired from the first measuring point; and
a warning module that issues, based on a judgment result from the judging module, alert information as to which of the first thresholds and the second thresholds are exceed by the first process value.

* * * * *